(12) United States Patent
Cho et al.

(10) Patent No.: US 10,943,965 B2
(45) Date of Patent: Mar. 9, 2021

(54) PIXEL AND ORGANIC LIGHT EMITTING DISPLAY DEVICE INCLUDING THE SAME

(71) Applicant: Samsung Display Co., Ltd., Yongin-si (KR)

(72) Inventors: Youngjin Cho, Seoul (KR); Hyunwoong Kim, Gwangmyeong-si (KR); Joong-soo Moon, Hwaseong-si (KR); Seung-kyu Lee, Asan-si (KR); Yangwan Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/406,825

(22) Filed: May 8, 2019

(65) Prior Publication Data

US 2020/0027939 A1 Jan. 23, 2020

(30) Foreign Application Priority Data

Jul. 17, 2018 (KR) ........................ 10-2018-0082990

(51) Int. Cl.
*H01L 27/32* (2006.01)
*G09G 3/3275* (2016.01)
(Continued)

(52) U.S. Cl.
CPC ....... *H01L 27/3262* (2013.01); *G09G 3/3225* (2013.01); *G09G 3/3266* (2013.01);
(Continued)

(58) Field of Classification Search
CPC ............. H01L 27/3262; H01L 27/3272; H01L 27/3276; G09G 3/3225; G09G 3/3266; G09G 3/3275
See application file for complete search history.

(56) References Cited

U.S. PATENT DOCUMENTS 9,231,000 B2 1/2016 Ko et al.
9,997,582 B2 6/2018 Lee et al.
(Continued)

FOREIGN PATENT DOCUMENTS

KR 10-2014-0108023 A 9/2014
KR 10-2017-0019547 A 2/2017
(Continued)

*Primary Examiner* — Fernando L Toledo
*Assistant Examiner* — Valerie N Newton
(74) *Attorney, Agent, or Firm* — Lewis Roca Rothgerber Christie LLP

(57) ABSTRACT

Provided is pixel including a first transistor including a first drain region electrically connected to a light emitting diode, a first gate electrode, a first channel region overlapping the first gate electrode, and a first source region, a first sub-transistor including a first sub-gate electrode, a first sub-channel region overlapping the first sub-gate electrode, a first sub-drain region connected to the first gate electrode, and a first sub-source region, a second sub-transistor including a second sub-gate electrode, a second sub-channel region overlapping the second sub-gate electrode, a second sub-drain region connected to the first sub-source region, and a second sub-source region, and a shielding pattern overlapping the first sub-source region and the second sub-drain region and not overlapping the first sub-channel region, wherein a width of the first sub-channel region is greater than a width of the second sub-channel region.

14 Claims, 14 Drawing Sheets

(51) Int. Cl.
*G09G 3/3225* (2016.01)
*G09G 3/3266* (2016.01)

(52) U.S. Cl.
CPC ....... *G09G 3/3275* (2013.01); *H01L 27/3272* (2013.01); *H01L 27/3276* (2013.01)

(56) References Cited

U.S. PATENT DOCUMENTS

| | | | |
|---|---|---|---|
| 2005/0041169 A1* | 2/2005 | Hashimoto | G02F 1/1368 349/43 |
| 2017/0125441 A1* | 5/2017 | Jian | H01L 27/1222 |
| 2017/0287996 A1 | 10/2017 | Kim et al. | |
| 2017/0345883 A1 | 11/2017 | Song et al. | |
| 2018/0063953 A1 | 3/2018 | Jo et al. | |

FOREIGN PATENT DOCUMENTS

| | | |
|---|---|---|
| KR | 10-2017-0115148 A | 10/2017 |
| KR | 10-2017-0136146 A | 12/2017 |

* cited by examiner

PIXEL AND ORGANIC LIGHT EMITTING DISPLAY DEVICE INCLUDING THE SAME

CROSS-REFERENCE TO RELATED APPLICATION

This application claims priority to, and the benefit of, Korean Patent Application No. 10-2018-0082990, filed on Jul. 17, 2018, the entire contents of which are hereby incorporated by reference.

BACKGROUND

1. Field

The present disclosure herein relates to a pixel and an organic light emitting display device including the same.

2. Description of the Related Art

An organic light emitting display device includes a plurality of pixels. Each of the plurality of pixels includes an organic light emitting diode and a circuit part for controlling the organic light emitting diode. The circuit part includes at least a switching transistor, a driving transistor, and a storage capacitor.

The organic light emitting diode includes an anode, a cathode, and an organic light emitting layer between the anode and the cathode. The organic light emitting diode emits light when a voltage that is greater than a threshold voltage is applied to the organic light emitting layer between the anode and the cathode.

SUMMARY

The present disclosure is to provide a pixel capable of improving display quality and an organic light emitting display having the same.

An embodiment of the present disclosure provides a pixel including a light emitting diode including an anode and a cathode, a first transistor including a first drain region electrically connected to the anode of the light emitting diode, a first gate electrode, a first channel region overlapping the first gate electrode in a plan view, and a first source region facing the first drain region with the first channel region therebetween, a first sub-transistor including a first sub-gate electrode, a first sub-channel region overlapping the first sub-gate electrode in a plan view, a first sub-drain region connected to the first gate electrode, and a first sub-source region facing the first sub-drain region with the first sub-channel region therebetween, a second sub-transistor including a second sub-gate electrode, a second sub-channel region overlapping the second sub-gate electrode in a plan view, a second sub-drain region connected to the first sub-source region, and a second sub-source region facing the second sub-drain region with the second sub-channel region therebetween, and a shielding pattern overlapping the first sub-source region and the second sub-drain region in a plan view and not overlapping the first sub-channel region, wherein a width of the first sub-channel region is greater than a width of the second sub-channel region.

The shielding pattern may be configured to receive a driving voltage.

The shielding pattern may overlap the first sub-source region and the second sub-drain region to form an auxiliary capacitor.

The shielding pattern might not overlap the second sub-channel region in a plan view.

The pixel may further include extension part on a different layer than, and overlapping, the first gate electrode to form a capacitor.

The shielding pattern may be on the same layer as the extension part.

A length of the first sub-channel region may be shorter than a length of the second sub-channel region.

The pixel may further include a sixth transistor including a sixth source region connected to the first drain region of the first transistor, a sixth drain region connected to the anode of the light emitting diode, and a sixth channel region between the sixth source region and the sixth drain region.

The pixel may further include a connection member connected to, and on a different layer than, the first gate electrode, wherein the first sub-drain region is connected to the connection member.

The pixel may further include an upper shielding pattern on the same layer as the connection member, and overlapping the first sub-source region and the second sub-drain region in a plan view.

The pixel may further include a fourth transistor including a fourth gate electrode, a fourth channel region overlapping the fourth gate electrode in a plan view, a fourth drain region connected to the first gate electrode, and a fourth source region facing the fourth drain region with the fourth channel region therebetween.

In an embodiment of the present disclosure, a pixel includes a light emitting diode including an anode and a cathode, a first transistor including a first drain region electrically connected to the anode of the light emitting diode, a first gate electrode, a first channel region overlapping the first gate electrode in a plan view, and a first source region facing the first drain region with the first channel region therebetween, a first sub-transistor including a first sub-gate electrode, a first sub-channel region overlapping the first sub-gate electrode in a plan view, a first sub-drain region connected to the first gate electrode, and a first sub-source region facing the first sub-drain region with the first sub-channel region therebetween, a second sub-transistor including a second sub-gate electrode, a second sub-channel region overlapping the second sub-gate electrode in a plan view, a second sub-drain region connected to the first sub-source region, and a second sub-source region facing the second sub-drain region with the second sub-channel region therebetween, a shielding pattern overlapping the first sub-source region and the second sub-drain region in a plan view and not overlapping the first sub-channel region, and an upper shielding pattern on a different layer than the shielding pattern, and overlapping the first sub-source region and the second sub-drain region in a plan view, wherein a width of the first sub-channel region is greater than a width of the second sub-channel region.

The pixel may further include a fourth transistor including a fourth gate electrode, a fourth channel region overlapping the fourth gate electrode in a plan view, a fourth drain region connected to the first gate electrode, and a fourth source region facing the fourth drain region with the fourth channel region therebetween.

Each of the shielding pattern and the upper shielding pattern may be configured to receive a driving voltage.

The shielding pattern may overlap the first sub-source region and the second sub-drain region to form an auxiliary capacitor, and the upper shielding pattern may overlap the first sub-source region and the second sub-drain region to form a second auxiliary capacitor.

The pixel may further include an extension part on a different layer than the first gate electrode, wherein the extension part overlaps the first gate electrode to form a capacitor.

The shielding pattern may be on the same layer as the extension part.

In an embodiment of the present disclosure, an organic light emitting display device includes a scan driving circuit configured to sequentially provide scan signals to scan lines extending in a first direction and arranged in a second direction that is orthogonal to the first direction, a data driving circuit configured to provide data signals to data lines that insulatingly cross the scan lines, and pixels including a light emitting diode having an anode and a cathode, and a circuit part configured to control a light emission of the light emitting diode, the circuit part including a first transistor including a first drain region electrically connected to the anode of the light emitting diode, a first gate electrode, a first channel region overlapping the first gate electrode in a plan view, and a first source region facing the first drain region with the first channel region therebetween, a first sub-transistor including a first sub-gate electrode, a first sub-channel region overlapping the first sub-gate electrode in a plan view, a first sub-drain region connected to the first gate electrode, and a first sub-source region facing the first sub-drain region with the first sub-channel region therebetween, a second sub-transistor including a second sub-gate electrode, a second sub-channel region overlapping the second sub-gate electrode in a plan view, a second sub-drain region connected to the first sub-source region, and a second sub-source region facing the second sub-drain region with the second sub-channel region therebetween, and a shielding pattern overlapping the first sub-source region and the second sub-drain region in a plan view and not overlapping the first sub-channel region, wherein a width of the first sub-channel region is greater than a width of the second sub-channel region.

The shielding pattern may be configured to receive a driving voltage.

The circuit part may further include an upper shielding pattern on a different layer from the shielding pattern, and overlapping the first sub-source region and the second sub-drain region in a plan view.

Accordingly, the organic light emitting display of the claimed embodiments may reduce the leakage current through the third transistor by increasing the capacitance between the connection node of the switching transistor having the dual gate electrode and the power supply voltage wiring. Therefore, the display quality of the organic light emitting display device may be improved.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain aspects of the present disclosure. In the drawings.

DETAILED DESCRIPTION

Figure 1:
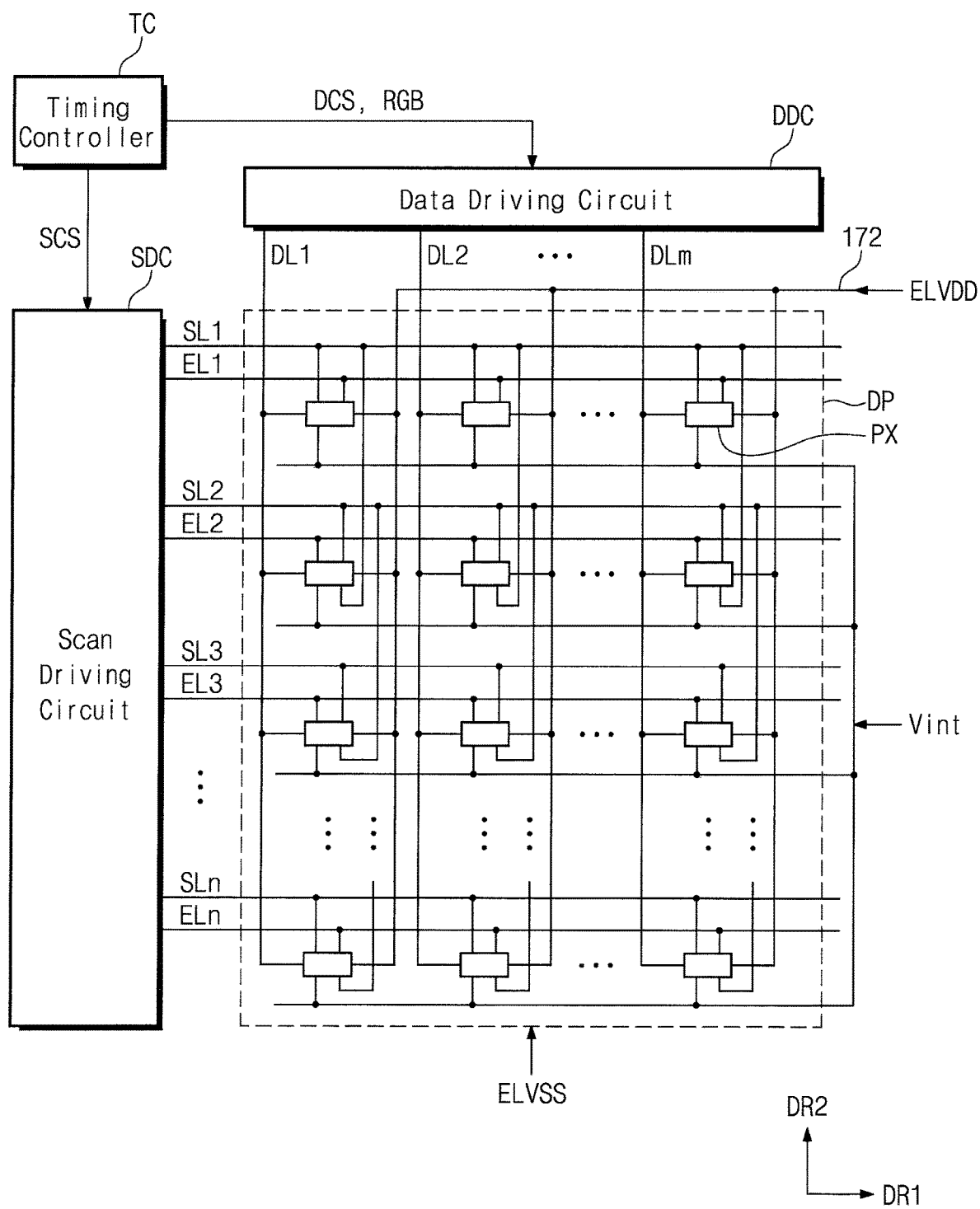
FIG. 1 is a block diagram illustrating an organic light emitting display device according to an embodiment of the present disclosure.

In this specification, when it is mentioned that a component (or, an area, a layer, a part, etc.) is referred to as being "on", "connected to" or "combined to" another component, this means that the component may be directly on, connected to, or combined to the other component or a third component therebetween may be present.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. These terms are used only to distinguish one component from other components. For example, a first component may be referred to as a second component and vice versa without departing from the scope of the present disclosure. The singular expressions include plural expressions unless the context clearly dictates otherwise.

In addition, terms such as "below", "the lower side", "on", and "the upper side" are used to describe a relationship of configurations shown in the drawing. The terms are described as a relative concept based on a direction shown in the drawing.

Unless otherwise defined, all terms (including technical and scientific terms) used herein have the same meaning as terms commonly understood by those skilled in the art to which this invention belongs. In general, the terms defined in the dictionary should be considered to have the same meaning as the contextual meaning of the related art, and, unless clearly defined herein, should not be understood abnormally or as having an excessively formal meaning.

In various embodiments of the present disclosure, the term "include," "comprise," "including," or "comprising," specifies a property, a region, a fixed number, a step, a process, an element and/or a component but does not exclude other properties, regions, fixed numbers, steps, processes, elements and/or components.

Hereinafter, another embodiment of the present disclosure will be described with reference to the drawings.

FIG. 1 is a block diagram of an organic light emitting display device according to an embodiment of the present disclosure.

Referring to FIG. 1, the organic light emitting display device includes a timing controller TC, a scan driving circuit SDC, a data driving circuit DDC, and a display panel DP.

The timing controller TC receives the input image signals and converts the data format of the input image signals according to an interface specification with the data driving circuit DDC to generate the image data RGB. The timing controller TC outputs a scan control signal SCS, image data RGB, and a data control signal DCS.

The scan driving circuit SDC receives the scan control signal SCS from the timing controller TC. The scan control signal SCS may include a vertical start signal for stating an operation of the scan driving circuit SDC, and a clock signal for determining the output timings of signals. The scan driving unit 200 generates a plurality of scan signals, and sequentially outputs the plurality of scan signals to a plurality of scan lines SL1 to SLn, which will be described later. Additionally, the scan driving circuit SDC generates a plurality of light emitting control signals in response to the scan control signal SCS, and outputs the plurality of light emitting control signals to a plurality of light emitting lines EL1 to ELn, which will be described later.

Although it is shown in FIG. 1 that the plurality of scan signals and the plurality of light emitting control signals are outputted from one scan driving circuit SDC, the present disclosure is not limited thereto. In another embodiment, a plurality of scan driving circuits may divide and output a plurality of scan signals, and may divide and output a plurality of light emitting control signals. Additionally, in another embodiment, a driving circuit for generating and outputting a plurality of scan signals, and a driving circuit for generating and outputting a plurality of light emitting control signals, may be separately classified.

The data driving circuit DDC receives the data control signal DCS and the image data RGB from the timing controller TC. The data driving circuit DDC converts the image data RGB into data signals, and outputs the data signals to a plurality of data lines DL1 to DLm, which will be described later. The data signals are analog voltages corresponding to a grayscale value of the image data RGB.

The display panel DP includes scan lines SL1 to SLn, light emitting lines EL1 to ELn, data lines DL1 to DLm, and pixels PX. The scan lines SL1 to SLn extend in a first direction DR1, and are arranged in a second direction DR2 that is orthogonal to the first direction DR1.

The plurality of light emitting lines EL1 to ELn may be arranged parallel to the scan lines SL1 to SLn. The data lines DL1 to DLm insulatingly cross the scan fines SL1 to SLn.

Each of the plurality of pixels PX connects to a corresponding scan line among the scan lines SL1 to SLn, a corresponding light emitting line among the light emitting lines EL1 to ELn, and a corresponding data line among the data lines DL1 to DLm.

Each of the pixels PX receives a first driving voltage ELVDD, and a second driving voltage ELVSS that has a lower level than the first driving voltage ELVDD. Each of the pixels PX is connected to the driving voltage line 172 to which the first driving voltage ELVDD is applied. Each of the pixels PX connects to an initialization voltage line 159 (see FIG. 2) for receiving an initialization voltage Vint.

Each of the plurality of pixels PX may be electrically connected to two respective scan lines. As shown in FIG. 1, the pixels of the second pixel row may be connected to the first and second scan lines SL1 and SL2.

In embodiments of the present disclosure, the display panel DP may further include a plurality of dummy scan lines. The display panel DP may further include a dummy scan line connected to the pixels PX of the first pixel row, and a dummy scan line connected to the pixels PX of the n-th (e.g., last) pixel row. Additionally, respective pixels (hereinafter referred to as the pixels of a pixel column) connected to one data line among the data lines DL1 to DLm may be connected to each other. For example, two adjacent pixels among pixels in a pixel column may be electrically connected to each other.

Each of the plurality of pixels PX includes an organic light emitting diode and a circuit part for controlling the light emission of the organic light emitting diode. The pixel circuit part may include a plurality of thin film transistors and a capacitor. At least one of the scan driving circuit SDC and the data driving circuit DDC may include thin film transistors formed through the same process as the pixel circuit part.

The scan lines SL1 to SLn, the light emitting lines EL1 to ELn, the data lines DL1 to DLm, the driving voltage line 172, the initialization voltage line 159, the pixels PX, the scan driving circuit SDC, and the data driving circuit DDC may be formed on a base substrate through one or more instances of a photolithography process. Through a plurality of instances of a deposition process or a coating process, insulation layers may be formed on a base substrate. Each of the insulation layers may be a thin film for covering the entire display panel DP, or may include at least one insulation pattern overlapping a specific configuration of the display panel DP. The insulation layers include an organic layer and/or an inorganic layer. In addition, a sealing layer for protecting the pixels PX may be further formed on the base substrate.

The display panel DP receives the first driving voltage ELVDD and the second driving voltage ELVSS. The first driving voltage ELVDD may be provided to the plurality of pixels PX through the driving voltage line 172. The second driving voltage ELVSS may be provided to a plurality of pixels PX through electrodes or a power supply line formed on the display panel DP.

The display panel DP receives the initialization voltage Vint. The initialization voltage Vint may be provided to the plurality of pixels PX through the initialization voltage line 159.

Figure 2:
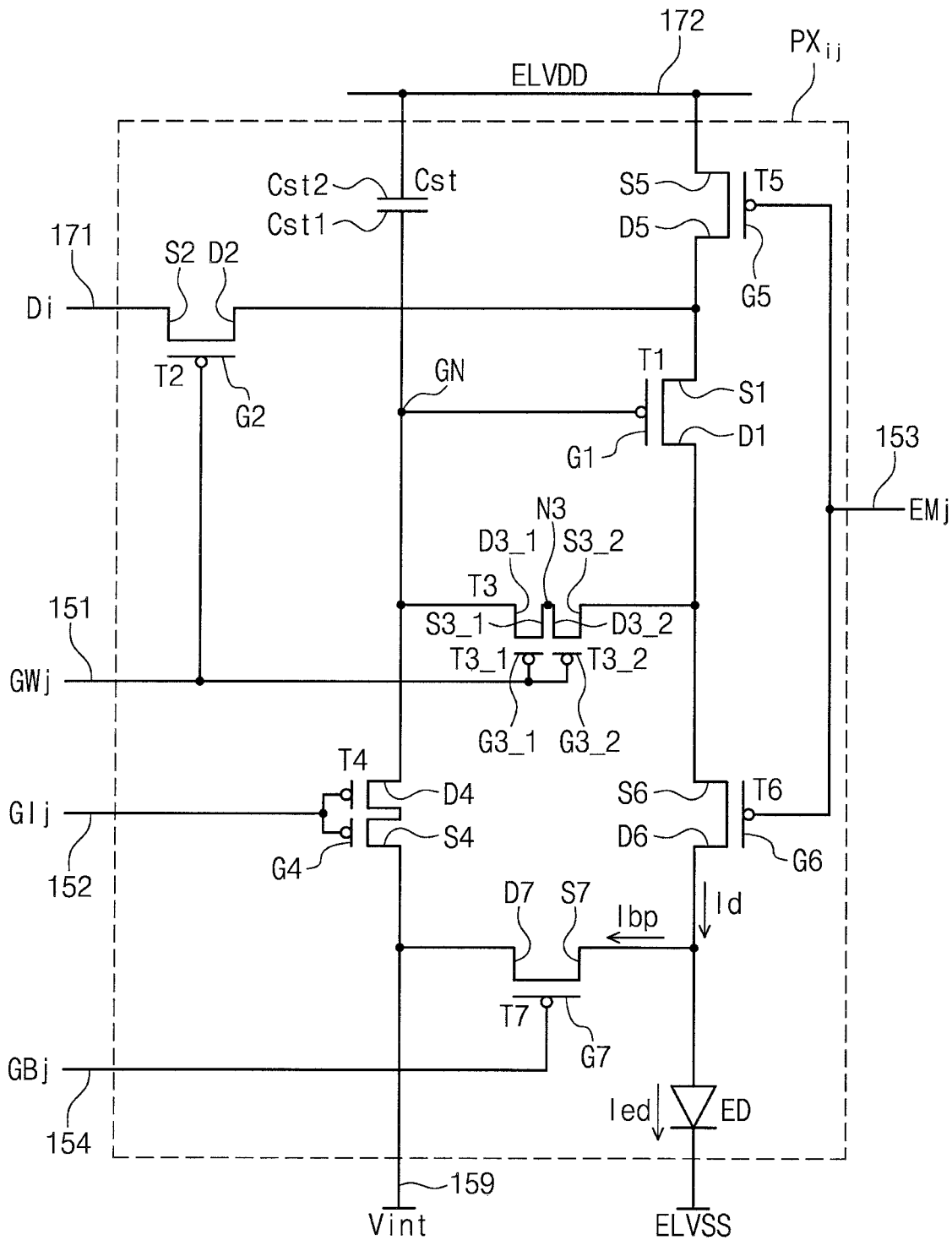
FIG. 2 is an equivalent circuit diagram of a pixel according to an embodiment of the present disclosure.
Figure 3:
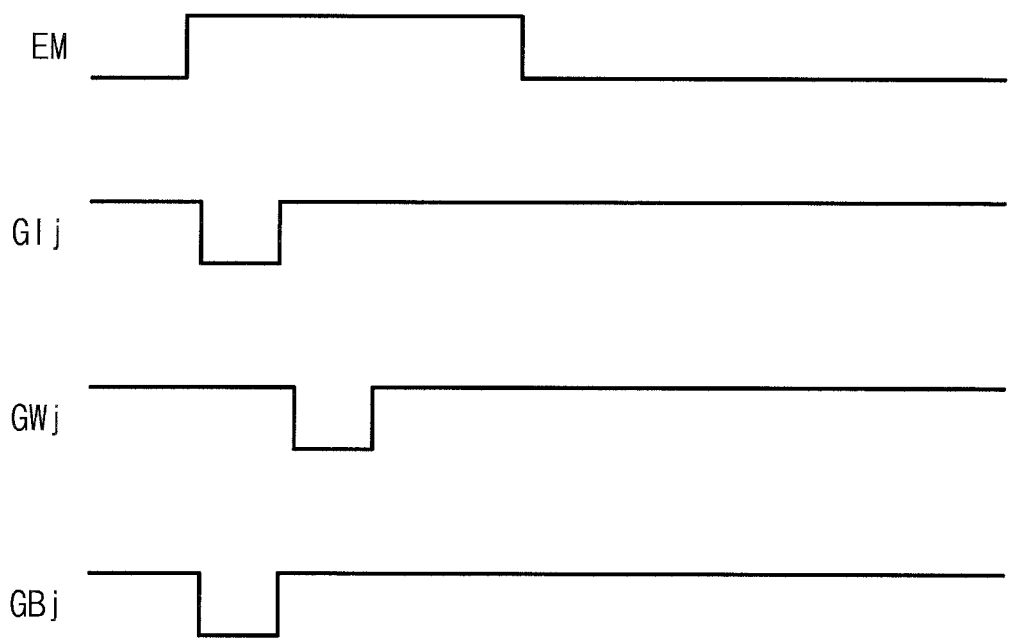
FIG. 3 is a waveform diagram showing driving signals for driving the pixel shown in FIG. 2.

FIG. 2 is an equivalent circuit diagram of a pixel according to an embodiment of the present disclosure. FIG. 3 is a timing diagram for explaining an operation of a pixel of the organic light emitting diode display of FIG. 2.

FIG. 2 shows an equivalent circuit diagram of a pixel PXij connected to an i-th data line 171 among a plurality of data lines DL1 to DLm, a j-th scan line 151 among a plurality of scan lines SL1 to SLn, and a j-th light emitting line 153 among the plurality of light emitting lines EL1 to ELn, which are shown in FIG. 1. Each of the plurality of pixels PX shown in FIG. 1 may have the same circuit configuration as that of the equivalent circuit of the pixel PXij shown in FIG. 2. In this embodiment, the circuit part of the pixel PXij includes seven transistors T1 to T7 and one capacitor Cst. In addition, the first to seventh transistors T1 to T7 may be P-type channel transistors, such as PMOS transistors. However, the present disclosure is not limited to this, and at least one of the first to seventh transistors T1 to T7 may be an N-type channel transistor. In addition, the circuit configuration of the pixel according to the present disclosure is not limited to FIG. 2. The circuit part shown in FIG. 2 is only one example, and the configuration of the circuit part may be modified and implemented.

Referring to FIG. 2, a pixel PXij of a display device according to an embodiment includes signal lines 151, 152, 153, 154, 171, and 172. The pixel PXij may include first to seventh transistors T1, T2, T3, T4, T5, T6, and T7 connected to the plurality of signal lines 151, 152, 153, 154, 171, and 172, a capacitor Cst, and at least one light emitting diode ED. In this embodiment, an example in which one pixel PXij includes one light emitting diode ED will be described.

The signal lines 151, 152, 153, 154, 171 and 172 include scan lines 151, 152 and 154, a control line 153, a data line 171, and a drive voltage line 172.

The scan lines 151, 152, and 154 may transmit the scan signals GWj, Glj, and GBj, respectively. The scan signals GWj, Glj, and GBj may deliver a gate-on voltage and a gate-off voltage capable of turning on/off the transistors T2, T3, T4, and T7 included in the pixel PXij.

The scan lines 151, 152, 154 connected to the pixel PXij may include a first scan line 151 capable of transmitting a scan signal GWj, a second scan line 152 capable of transmitting a scan signal Glj having a gate-on voltage at a timing different from that of the first scan line 151, and a third scan line 154 capable of transmitting the scan signal GBj. In this embodiment, an example in which the second scan line 152 transmits a gate-on voltage at a timing earlier than the first scan line 151 will be mainly described. For example, when the scan signal GWj is the j-th scan signal Sj (j is a natural number of 1 or more) among the scan signals applied during one frame, the scan signal Glj may be a previous scan signal, such as the (j−1)-th scan signal S(j−1), and the scan signal GBj may be a (j−1)-th scan signal S(j−1). However, the present disclosure is not limited thereto, and the scan signal GBj may be a scan signal other than the (j−1)-th scan signal S(j−1).

The control line 153 may transmit a control signal and may transmit a light emitting control signal capable of controlling the light emission of the light emitting diode ED included in the pixel PXij. The light emitting control signal transmitted from the control line 153 may have a waveform that is different from that of the scan signal transmitted from the scan lines 151, 152 and 154. The data line 171 may transmit the data signal Di, and the driving voltage line 172 may transmit the first driving voltage ELVDD. The data signal Di may have a different voltage level depending on a video signal inputted to the display device, and the first driving voltage ELVDD may have a substantially constant level.

The first scan line 151 may transmit a scan signal GWj to the second transistor T2 and to the third transistor T3, the second scan line 152 may transmit the scan signal Glj to the fourth transistor T4, the third scan line 154 may transmit a scan signal GBj to the seventh transistor T7, and the control line 153 may transmit a light emitting control signal EMj to the fifth transistor T5 and to the sixth transistor T6.

The gate electrode G1 of the first transistor T1 is connected to the one end Cst1 of the capacitor Cst through the driving gate node GN, the source electrode S1 of the first transistor T1 is connected to the driving voltage line 172 through the fifth transistor T5, and the drain electrode D1 of the first transistor T1 is electrically connected to the anode of the light emitting diode ED through the sixth transistor T6. The first transistor T1 may receive the data signal Di transmitted from the data line 171 according to the switching operation of the second transistor T2, and may supply the driving current Id to the light emitting diode ED.

The gate electrode G2 of the second transistor T2 is connected to the first scan line 151, the source electrode S2 of the second transistor T2 is connected to the data line 171, and the drain electrode D2 of the second transistor T2 is connected to the source electrode S1 of the first transistor T1 and to the driving voltage line 172 through the fifth transistor T5. The second transistor T2 is turned on according to the scan signal GWj received through the first scan line 151, and supplies the data signal Di transmitted from the data line 171 to the source electrode S1 of the first transistor T1.

The third transistor T3 may have a dual gate structure in which a first sub-transistor T3_1 and a second sub-transistor T3_2 are connected in series between the driving gate node GN and the drain electrode D1 of the first transistor T1. The first sub-gate electrode G3_1 of the first sub-transistor T3_1 and the second sub-gate electrode G32 of the second sub-transistor T3_2 are connected to the first scan line 151. The first sub-drain electrode D3_1 of the first sub-transistor T3_1 is commonly connected to the drain electrode D4 of the fourth transistor T4, to one end Cst1 of the capacitor Cst, and to the gate electrode G1 of the first transistor T1. The second sub-source electrode S3_2 of the second sub-transistor T3_2 is connected to the drain electrode D1 of the first transistor T1 and to the anode of the light emitting diode ED through the sixth transistor T6. The first sub-source electrode S3_1 of the first sub-transistor T3_1 and the second sub-drain electrode D3_2 of the second sub-transistor T3_2 are connected to each other. For example, the third transistor T3 may have a structure in which the first and second sub-gate electrodes G3_1 and G3_2 of the first and second sub-transistors T3_1 and T3_2 are connected to each other on a gate insulating layer through a wire, and a high-concentration region having high conductivity is provided between the gates as a gate common area. Further, in another embodiment, the third transistor T3 may be implemented as one transistor or as three or more transistors.

The third transistor T3 is turned on according to the scan signal GWj received through the first scan line 151 to connect the gate electrode G1 and the drain electrode D1 of the first transistor T1 such that the first transistor T1 is connected as a diode (e.g. diode connected).

The gate electrode G4 of the fourth transistor T4 is connected to the second scan line 152, and the source electrode S4 of the fourth transistor T4 is connected to the terminal of the initialization voltage line 159 to receive the initialization voltage Vint, and the drain electrode D4 of the fourth transistor T4 is connected to the one end Cst1 of the capacitor Cst, to the gate electrode G1 of the first transistor T1, and to the drain electrode D3 of the third transistor T3 (e.g., to D3_1). The fourth transistor T4 is turned on according to the scan signal Glj received through the second scan line 152 to transmit the initialization voltage Vint to the gate electrode G1 of the first transistor T1, so that it may perform an initialization operation for initializing the voltage of the gate electrode G1 of the first transistor T1. The fourth transistor T4 may have a dual gate structure like the third transistor T3.

The gate electrode G5 of the fifth transistor T5 is connected to the control line 153, the source electrode S5 of the fifth transistor T5 is connected to the driving voltage line 172, and the drain electrode D5 of the fifth transistor T5 is connected to the source electrode S1 of the first transistor T1 and to the drain electrode D2 of the second transistor T2.

The gate electrode G6 of the sixth transistor T6 is connected to the control line 153, and the source electrode S6 of the sixth transistor T6 is connected to the drain electrode D1 of the first transistor T1 and to the source electrode S3 of the third transistor T3 (e.g., S3_2), and the drain electrode D6 of the sixth transistor T6 is electrically connected to the anode of the light emitting diode ED. The fifth transistor T5 and the sixth transistor T6 are concurrently or simultaneously turned on according to the light emitting control signal EMj received through the control line 153, and through this, the first driving voltage ELVDD may be compensated through the diode-connected first transistor T1, and may be transmitted to the light emitting diode ED.

The gate electrode G7 of the seventh transistor T7 is connected to the third scan line 154, and the source electrode S7 of the seventh transistor T7 is connected to the drain electrode D6 of the sixth transistor T6 and to the anode of the light emitting diode ED, and the drain electrode D7 of the seventh transistor T7 is connected to the terminal of the initialization voltage line 159 to receive the initialization voltage Vint and to the source electrode S4 of the fourth transistor T4. In other embodiments, the gate electrode G7 of the seventh transistor T7 may be connected to a separate control line.

One end Cst1 of the capacitor Cst is connected to the gate electrode G1 of the first transistor T1, and the other end Cst2 of the capacitor Cst is connected to the driving voltage line 172 as described above. The cathode of the light emitting diode ED may be connected to the terminal for transmitting the second driving voltage ELVSS. The structure of the pixel PXij according to other embodiments is not limited to the structure shown in FIG. 2, and the number of transistors, the number of capacitors, and the connection relation in one pixel PXij may be variously modified.

The operation of the display device according to an embodiment will be described with reference to FIGS. 2 and 3. Hereinafter, an example in which the first to seventh transistors T1 to T7 are P-type channel transistors will be described, and the operation of one frame will be described.

Referring to FIGS. 2 and 3, scan signals Sj−1, Sj, and Sj+1, each of a low level, are sequentially applied as a scan signal GWj to the first scan line 151 connected to the pixel PXij within one frame.

During the initialization period, a low-level scan signal Glj is supplied through the second scan line 152. The scan signal Glj may be, for example, the (j−1)-th scan signal Sj−1. The fourth transistor T4 is turned on in response to the low level scan signal Glj, the initialization voltage Vint is connected to the gate electrode G1 of the first transistor T1 through the fourth transistor T4, and the initialization voltage Vint initializes the first transistor T1.

Next, when the low level scan signal GWj is supplied through the first scan line 151 during the data programming and compensation period, the second transistor T2 and the third transistor T3 are turned on in response to the low level scan signal GWj. The scan signal GWj may be, for example, the j-th scan signal Sj. At this time, the first transistor T1 is diode-connected by the turned-on third transistor T3, and is biased in the forward direction. Then, the compensation voltage Di−|Vth| (e.g. see FIG. 7), which is a voltage corresponding to the data signal Di from the data line 171 being reduced by the threshold voltage Vth of the first transistor T1, is applied to the gate electrode G1 of the first transistor T1. That is, the gate voltage applied to the gate electrode G1 of the first transistor T1 may be the compensation voltage Di−|Vth|.

The first driving voltage ELVDD and the compensation voltage Di−|Vth| are applied to respective ends of the capacitor Cst, and the charge corresponding to the voltage difference between both ends may be stored in the capacitor Cst.

During the bypass period, the seventh transistor T7 receives the scan signal GBj of the low level through the third scan line 154, and is turned on. The scan signal GBj may be the (j−1)-th scan signal Sj−1. A part of the driving current Id may be passed through the seventh transistor T7 as the bypass current Ibp due to the turned-on seventh transistor T7.

Even when the minimum current of the driving transistor T1 for displaying a black image flows as the driving current, if the light emitting diode ED emits light, the black image is not properly displayed. Therefore, the bypass transistor T7 of the organic light emitting diode display according to the present embodiment disperses a portion of the minimum current of the driving transistor T1 as a bypass current Ibp to another current path that is other than the current path through the organic light emitting diode. Here, the minimum current of the driving transistor T1 means a current under the condition that the driving transistor T1 is turned off because the gate-source voltage Vgs of the driving transistor T1 is smaller than the threshold voltage Vth. The minimum driving current (e.g., a current of about 10 pA or less) under the condition that the driving transistor T1 is turned off is transmitted to the light emitting diode ED to be expressed as a black luminance image.

It may be said that when a minimum driving current for displaying a black image flows, the influence of bypass transmission of the bypass current Ibp is large, and when a large driving current for displaying an image such as a normal image or a white image flows, there is almost no influence of the bypass current Ibp. Therefore, when a driving current for displaying a black image flows, the light emission current Ied of the organic light emitting diode OLED, which is reduced from the drive current Id by the amount of the bypass current Ibp exiting through the bypass transistor T7, may have a minimum current amount at a level that may reliably express a black image. Accordingly, an accurate black luminance image may be realized by using the bypass transistor T7, so that a contrast ratio of the display may be improved. In this embodiment, the scan signal GBj, which is a bypass signal, is the same as the previous scan signal Sj−1, but other embodiments are not necessarily limited thereto.

Next, the light emitting control signal EMj supplied from the control line 153 during the light emission period is changed from the high level to the low level, During the light emission period, the fifth transistor T5 and the sixth transistor T6 are turned on by the low-level light emitting control signal EMj. Then, a driving current Id corresponding to the voltage difference between the gate voltage of the gate electrode G1 of the first transistor T1 and the first driving voltage ELVDD is generated, and the driving current Id is supplied to the light emitting diode ED through the sixth transistor T6 so that the current Ied flows through the light emitting diode ED. During the light emission period, the gate-source voltage Vgs of the first transistor T1 is maintained at '(Di−|Vth|)-ELVDD' by the capacitor Cst, and according to the current-to-voltage relationship of the first transistor T1, the driving current Id may be proportional to the square '(Di to ELVDD)$^2$' of the value obtained by subtracting the threshold voltage from the driving gate-source voltage. Accordingly, the driving current Id may be determined regardless of the threshold voltage Vth of the first transistor T1.

A structure of a pixel according to an embodiment will be described with reference to FIGS. 4 and 5. For convenience of understanding, first, a planar structure of a pixel according to an embodiment will be mainly described, and then a sectional structure will be described in detail.

Figure 4:
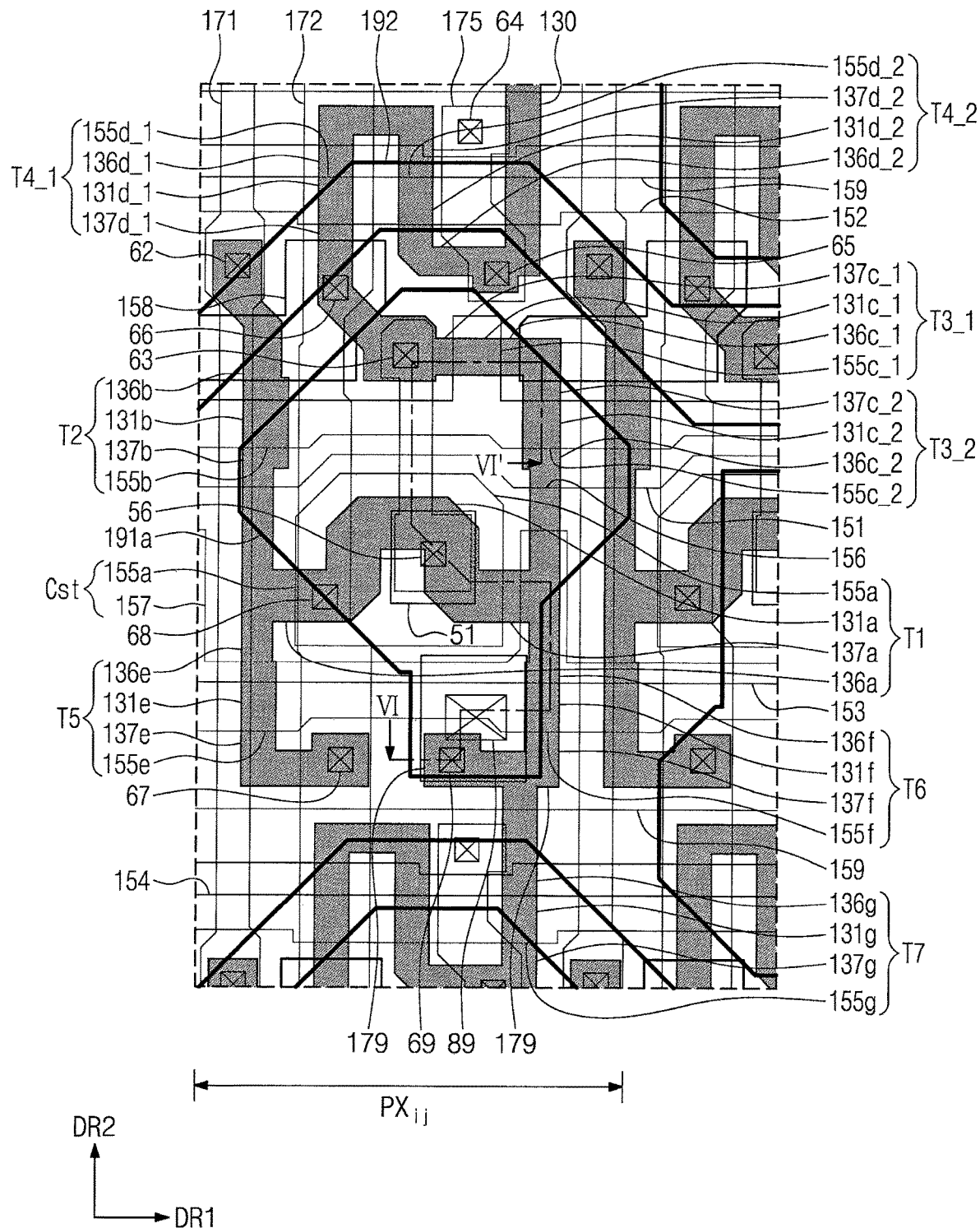
FIG. 4 is a plan view of one pixel of a display device according to an embodiment.

FIG. 4 is a plan view of one pixel of a display device according to an embodiment. FIG. 5 is a cross-sectional view taken along the line VI-VI' of the display device shown in FIG. 4.

The pixel PXij according to an embodiment may include a first conductive layer including a first scan line 151 for transmitting the scan signal GWj, a second scan line 152 for transmitting the scan signal Glj, a third scan line 154 for transmitting the scan signal GBj, and a control line 153 for transmitting a light emitting control signal EMj. The first conductive layer may be located on one side of the substrate 110 on a cross section, and may include the same material and may be located on a single layer. The substrate 110 may include inorganic or organic insulating materials such as glass, plastic, and the like, and may have various degrees of flexibility.

The scan lines 151, 152 and 154 and the control line 153 may extend substantially in the same direction (e.g., in the first direction DR1) on a plane (e.g., in a plan view). The first scan line 151 may be located between the second scan line 152 and the control line 153 on a plane.

The pixel PXij of the display device according to an embodiment may further include a second conductive layer including a storage line 156 and an initialization voltage line 159 and the like. The second conductive layer is located on a layer different from the first conductive layer with respect to a cross section. For example, the second conductive layer may be located on the first conductive layer on a cross-section (e.g., with reference to a cross-sectional view), and may include the same material and may be located on a single layer.

The storage line 156 and the initialization voltage line 159 extend relatively in the same direction (e.g., in the first direction DR1) on a plane.

The storage line 156 may be located between the first scan line 151 and the control line 153 on a plane, and may include an extension part 157. The extension part 157 may be connected to the driving voltage line 172 through the contact hole 68 to receive the first driving voltage ELVDD.

The initialization voltage line 159 may transfer the initialization voltage Vint, and may be positioned between the third scan line 154 and the control line 153 on a plane, but the present disclosure is not limited thereto.

The pixel PXij according to an embodiment includes a third conductive layer including a data line 171 for transmitting a data signal Di, and a driving voltage line 172 for transmitting a first driving voltage ELVDD. The third conductive layer is located on a layer that is different from the first conductive layer and the second conductive layer on a cross section. For example, the third conductive layer may be located on the second conductive layer on a cross-section, and may include the same material and may be located on a single layer.

The data line 171 and the driving voltage line 172 may extend substantially in the same plane direction (e.g., in the second direction DR2), and may cross the scan lines 151, 152, and 154, the control line 153, the initialization voltage line 159, and the storage line 156.

The pixel PXij includes the first to seventh transistors T1 to T7 and the capacitor Cst, which are respectively connected to the scan lines 151, 152 and 154, the control line 153, the data line 171, and the drive voltage line 172, and a light emitting diode ED.

The channel of each of the first to seventh transistors T1 to T7 of the pixel PXij may be formed inside one active pattern 130, and the active pattern 130 may be bent into various shapes. The active pattern 130 may include a semiconductor material such as polycrystalline silicon, an oxide semiconductor, or the like. The active pattern 130 may be positioned between the substrate 110 and the first conductive layer on a cross section.

The active pattern 130 includes channel regions 131a, 131b, 131c_1, 131c_2, 131d_1, 131d_2, 131e, 131f, and 131g for forming the channels of the first to seventh transistors T1 to T7, respectively, and includes a conductive region. In particular, the third transistor T3 and the fourth transistor T4 may have a dual gate structure. In this case, the third transistor T3 includes two channel regions 131c_1 and 131c_2, and the fourth transistor T4 may include two channel regions 131d_1 and 131d_2.

The conductive region of the active pattern 130 is located on both sides of each of the channel regions 131a, 131b, 131c_1, 131c_2, 131d_1, 131d_2, 131e, 131f, and 131g, and has a carrier concentration that is higher than the carrier concentration of the channel regions 131a, 131b, 131c_1, 131c_2, 131d_1, 131d_2, 131e, 131f, and 131g. In the active pattern 130, the remaining portions except for the channel regions 131a, 131b, 131c_1, 131c2, 131d_1, 131d_2, 131e, 131f, and 131g may be mostly conductive regions. A pair of conductive regions located on respective sides of each of the channel regions 131a, 131b, 131c_1, 131c_2, 131d_1, 131d_2, 131e, 131f, and 131g of the first to seventh transistors T1 to T7, 7, as a source region and a drain region of each of the first to seventh transistors T1 to T7, may function as a source electrode and a drain electrode respectively.

The first transistor T1 includes a channel region 131a, a source region 136a and a drain region 137a, which are conductive regions of the active pattern 130 located on respective sides of the channel region 131a, and a driving gate electrode 155a overlapping the channel region 131a on a plane (e.g., in a plan view).

The channel region 131a of the first transistor T1 may be bent at least once. For example, the channel region 131a may have a meandering shape or a zigzag shape. FIG. 4 shows an example in which the channel region 131a includes an approximately up-and-down inverted U-shape.

The source region 136a and the drain region 137a are connected to respective sides of the channel region 131a on a plane.

The driving gate electrode 155a may be included in the first conductive layer, and may be connected to a connection member 174 through the contact hole 61. The connection member 174 may be included in the third conductive layer. The connection member 174 may extend mostly in a direction parallel to the direction in which the data line 171 extends. The connection member 174 corresponds to the driving gate node GN shown in the circuit diagram shown in FIG. 2 together with the driving gate electrode 155a.

The second transistor T2 includes a channel region 131b, a source region 136b and a drain region 137b, which are conductive regions of the active pattern 130 located on respective sides of the channel region 131b, and a gate electrode 155b overlapping the channel region 131b on a plane. The gate electrode 155b is a part of the first scan line 151. The source region 136b is positioned above a plane based on the first scan line 151, is connected to the channel region 131b, and is connected to the data line 171 through the contact hole 62. The drain region 137*b* is located below a plane based on the first scan line 151, is connected to the channel region 131*b*, and is connected to the source region 136*a* of the first transistor T1.

The third transistor T3 may be formed with two portions to reduce or prevent leakage current. That is, the third transistor T3 may include a first sub-transistor T3_1 and a second sub-transistor T3_2 that are adjacent to each other and that are connected to each other.

The first sub-transistor T3_1 includes a first sub-channel region 131*c*1 overlapping the first scan line 151 on a plane, a first sub-source region 136*c*_1 and a first sub-drain region 137*c*_1, which are conductive regions of the active pattern 130 located at respective sides of the first sub-channel region 131*c*_1, and a first sub-gate electrode 155*c*_1 overlapping the first sub-channel region 131*c*_1. The first sub-gate electrode 155*c*_1 may be a part of the protrusion part of the first scan line 151. The first sub-drain region 137*c*_1 is located above a plane based on the first scan line 151 and is connected to the connection member 174 through the contact hole 63.

The second sub-transistor T3_2 includes a second sub-channel region 131*c*_2 overlapping the first scan line 151 on a plane, and a second sub-source region 136*c*_2 and a second sub-drain region 137*c*_2, which are conductive regions of the active pattern 130 located on respective sides of the second sub-region 131*c*_2, and a second sub-gate electrode 155*c*_2 overlapping the second sub-channel region 131*c*_2. The second sub-gate electrode 155*c*_2 is a part of the first scan line 151.

The second sub-source region 136*c*_2 of the second sub-transistor T3_2 is connected to the drain region 137*a* of the first transistor T1, and the second sub-drain region 137*c*_2 is connected to the first sub-source region 136*c*_1 of the first sub-transistor T3_1. The connection node of the first sub-source region 136*c*_1 of the first sub-transistor T3_1 and the second sub-drain region 137*c*_2 of the second sub-transistor T3_2 is referred to as a third node N3 (e.g., see FIGS. 2 and 6).

The fourth transistor T4 may be formed with two portions to reduce or prevent leakage current. That is, the fourth transistor T4 may include a left fourth transistor T4_1 and a right fourth transistor T4_2 that are adjacent to each other and that are connected to each other.

The left fourth transistor T4_1 includes a channel region 131*d*_1 overlapping the second scan line 152 on a plane, a source region 136*d*_1 and a drain region 137*d*_1, which are conductive regions of the active pattern 130 located on respective sides of the channel region 131*d*_1, and a gate electrode 155*d*_1 overlapping the channel region 131*d*_1. The gate electrode 155*d*_1 is a part of the second scan line 152. The drain region 137*d*_1 is located below a plane based on the second scan line 152, is connected to the drain region 137*c*_1 of the first sub-transistor T3_1, and is connected to the connection member 174 through the contact hole 63.

The right fourth transistor T4_2 includes a channel region 131*d*_2 overlapping the second scan line 152 on a plane, a source region 136*d*_2 and a drain region 137*d*_2, which are conductive regions of the active pattern 130 located on respective sides of the channel region 131*d*_2, and a gate electrode 155*d*_2 overlapping the channel region 131*d*_2. The gate electrode 155*d*_2 is a part of the second scan line 152. The drain region 137*d*_2 is connected to the source region 136*d*_1 of the left fourth transistor T4_1, and the source region 136*d*_2 is connected to the connection member 175 through the contact hole 65.

The connection member 175 may be included in the second conductive layer or the third conductive layer on a cross section. When the connection member 175 is included in the third conductive layer, the connection member 175 may be electrically connected to the initialization voltage line 159 through the contact hole 64. When the connection member 175 is included in the second conductive layer, the connection member 175 may be located on the same layer as, and may be connected to, the initialization voltage line 159.

A boundary between the channel region 131*d*_1 and the source region 136*d*_1 of the left fourth transistor T4_1 directly connected to the connection member 174 for transmitting the voltage of the driving gate electrode 155*a*, and a boundary between the channel region 131*d*_1 and the drain region 137*d*_1, may be covered by the driving voltage line 172 on a plane together with the channel region 131*d*_1. The channel region 131*d*_1, a boundary between the channel region 131*d*_1 and the source region 136*d*_1, and a boundary between the channel region 131*d*_1 and the drain region 137*d*_1, may entirely overlap the driving voltage line 172 on a plane, and may be located in a region of the driving voltage line 172 on a plane. On a plane, the horizontal width of each of the channel region 131*d*_1, the source region 136*d*_1, and the drain region 137*d*_1 of the left fourth transistor T4_1 is narrower than the horizontal width of the driving voltage line 172. The channel region 131*d*_1, the source region 136*d*_1, and the drain region 137*d*_1 may all be located within the region of the driving voltage line 172.

As another transistor directly connected to the connection member 174 for transferring the voltage of the driving gate electrode 155*a*, there is a first sub-transistor T31.

The fifth transistor T5 includes a channel region 131*e*, a source region 136*e* and a drain region 137*e*, which are conductive regions of the active pattern 130 located on respective sides of the channel region 131*e*, and a gate electrode 155*e* overlapping the channel region 131*e*.

The gate electrode 155*e* is a part of the control line 153. The source region 136*e* is located below a plane based on the control line 153, is connected to the channel region 131*e*, and is connected to the driving voltage line 172 through the contact hole 67. The drain region 137*b* is located below a plane based on the first scan line 151, is connected to the channel region 131*b*, and is connected to the source region 136*a* of the first transistor T1.

The sixth transistor T6 includes a channel region 131*f*, a source region 136*f* and a drain region 137*f*, which are conductive regions of the active pattern 130 located on respective sides of the channel region 131*f*, and a gate electrode 155*f* overlapping the channel region 131*f*.

The gate electrode 155*f* is a part of the control line 153. The source region 136*f* is located above a plane based on the control line 153, is connected to the channel region 131*f*, and is connected to the drain region 137*a* of the first transistor T1. The drain region 137*f* is located below a plane based on the control line 153, is connected to the channel region 131*f*, and is connected to the connection member 179 through the contact hole 69. The connection member 179 may be included in the third conductive layer.

The seventh transistor T7 includes a channel region 131*g*, a source region 136*g* and a drain region 137*g*, which are conductive regions of the active pattern 130 located on respective sides of the channel region 131*g*, and a gate electrode 155*g* overlapping the channel region 131*g*.

The gate electrode 155*g* is a part of the third scan line 154. The source region 136*g* is located above a plane based on the third scan line 154, is connected to the channel region 131g, and is connected to the drain region 137f of the sixth transistor T6.

The drain region 137g may be positioned below a plane based on the third scan line 154, and may be connected to the connection member 175 through the contact hole 65 to receive the initialization voltage Vint.

The capacitor Cst may include, as two terminals, the driving gate electrode 155a and the extension part 157 of the storage line 156 overlapping each other on a plane. The capacitor Cst may maintain a voltage difference corresponding to a difference between voltages of the extension part 157 of the storage line 156 receiving the first driving voltage ELVDD and the driving gate electrode 155a. The extension part 157 of the storage line 156 may have a larger planar area than that of the drive gate electrode 155a, and may cover the entire area of the drive gate electrode 155a. The extension part 157 may be included in the second conductive layer.

The second conductive layer may further include a shielding pattern 158 overlapping the data line 171. The shielding pattern 158 may be connected to the driving voltage line 172 through the contact hole 66 to receive the first driving voltage ELVDD. The shielding pattern 158 shields between the driving gate node GN (e.g. see FIGS. 2 and 6) and the data line 171 to reduce or prevent the voltage change of the driving gate node GN due to the change of the data signal Di. On a plane, the width d1 (e.g., see FIGS. 8-10), which is the distance from the boundary between the channel region 131c_1 and the source region 136c_1 of the first sub-transistor T3_1 to the left edge of the shielding pattern 158, may be a distance (e.g., a predetermined distance of about 3 micrometers or more).

The pixel PXij according to an embodiment may further include a fourth conductive layer including a pixel electrode 191a, a pixel conductive pattern 192, and the like. The fourth conductive layer is located on a layer that is different from the first conductive layer, the second conductive layer, and the third conductive layer on a cross section. For example, the fourth conductive layer may be located on the third conductive layer on a cross-section, and may include the same material and may be located on a single layer. The pixel electrodes 191a may be arranged in a gentile matrix structure.

The pixel electrode 191a may be connected to the connection member 179 through the contact hole 89 to receive a voltage. The pixel conductive pattern 192 may transmit the initialization voltage Vint.

The channel region 131c_1 of the first sub-transistor T3_1, the boundary between the channel region 131c_1 and the source region 136c_1, and the boundary between the channel region 131c1 and the drain region 137c_1, are covered by the fourth conductive layer on a plane.

The cross-sectional structure of the display device according to an embodiment will be described in more detail with reference to FIG. 5.

A buffer layer 120 may be located on the substrate 110. The buffer layer 120 may reduce or prevent impurities from being transferred from the substrate 110 to the upper layer of the buffer layer 120 (e.g., past the buffer layer 120 to the active pattern 130), thereby improving the characteristics of the active pattern 130 and relieving stress. The buffer layer 120 may include an inorganic insulating material, such as silicon nitride (SiNx) or silicon oxide (SiOx) and/or an organic insulating material. At least a portion of the buffer layer 120 may be omitted in other embodiments.

The active pattern 130 as described above is located on the buffer layer 120, and the first insulating layer 141 is located on the active pattern 130.

The first conductive layer described above may be located on the first insulating layer 141. The first conductive layer may include a metal such as copper (Cu), aluminum (Al), molybdenum (Mo), and alloys thereof.

A second insulating layer 142 may be located on the first conductive layer and the first insulating layer 141.

The second conductive layer described above may be located on the second insulating layer 142. The second conductive layer may include a metal such as copper (Cu), aluminum (Al), molybdenum (Mo), and alloys thereof.

A third insulating layer 160 may be located on the second conductive layer and on the second insulating layer 142.

At least one of the first insulating layer 141, the second insulating layer 142, and the third insulating layer 160 may include an inorganic insulating material, such as silicon nitride (SiNx) or silicon oxide (SiOx) and/or an organic insulating material.

The first insulating layer 141, the second insulating layer 142, and the third insulating layer 160 may include or define a contact hole 61 positioned above the driving gate electrode 155a, a contact hole 62 positioned above the source region 136b of the second transistor T2, a contact hole 63 positioned on the drain region 137c_1 of the first sub-transistor T3_1 or the drain region 137d_1 of the left fourth transistor T4_1, a contact hole 64 positioned above the initialization voltage line 159, a contact hole 65 positioned on the source region 136d_2 of the right fourth transistor T4_2 or the drain region 137g of the seventh transistor T7, a contact hole 66 positioned above the shielding pattern 158, a contact hole 67 positioned above the source region 136e of the fifth transistor T5, a contact hole 68 positioned above the extension part 157 of the storage line 156, and a contact hole 69 positioned on the drain region 137f of the sixth transistor T6.

The third conductive layer described above may be located on the third insulating layer 160. The third conductive layer may include a metal, such as copper (Cu), aluminum (Al), molybdenum (Mo), and alloys thereof.

The extension part 157 of the storage line 156 may overlap the driving gate electrode 155a with the second insulating layer 142 therebetween to form a capacitor Cst.

A protective layer 180 is formed on the third conductive layer and the third insulating layer 160. The protective layer 180 may include an organic insulating material, such as a polyacrylic resin or a polyimide resin, and the upper surface of the protective layer 180 may be substantially flat. The protective layer 180 may include or define a contact hole 89 located above the connection member 179.

The above-described fourth conductive layer may be located on the protective layer 180.

A pixel defining layer (PDL) 350 may be located on the protective layer 180 and the fourth conductive layer. The PDL 350 has an opening part 351 located above the pixel electrodes 191a.

A light emitting layer 370 is located on the pixel electrode 191a. The light emitting layer 370 may be located in the opening part 351. The light emitting layer 370 may include an organic light emitting material or an inorganic light emitting material.

A common electrode 270 is located on the light emitting layer 370. The common electrode 270 may also be formed on the PDL 350, and may extend (e.g., continuously) over a plurality of pixels.

The pixel electrode 191a, the light emitting layer 370, and the common electrode 270 together form a light emitting diode ED.

A sealing layer for protecting the light emitting diode ED may further be located on the common electrode 270. The sealing layer may include alternately-stacked inorganic films and organic films.

Figure 6:
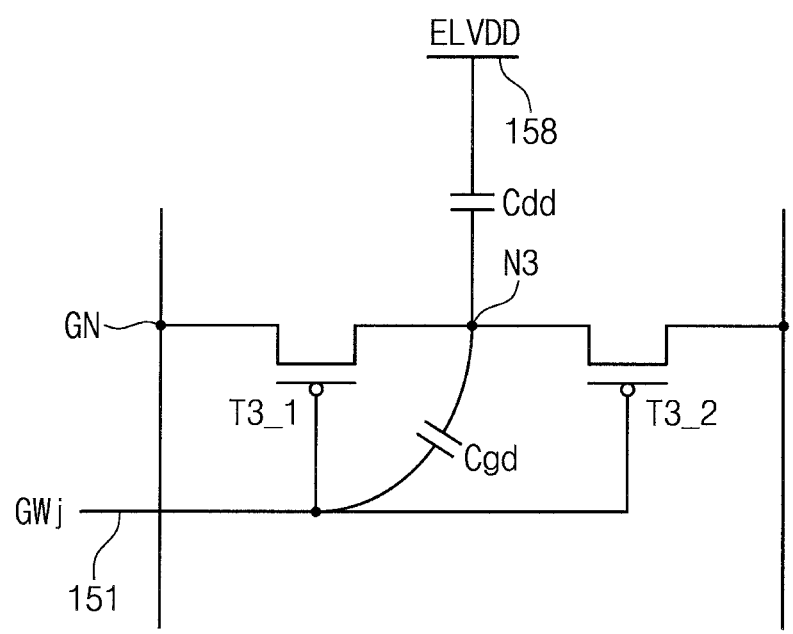
FIG. 6 is an equivalent circuit diagram for explaining sub-capacitors and parasitic capacitances formed by the first sub-transistor and the second sub-transistor shown in FIG. 2.
Figure 7:
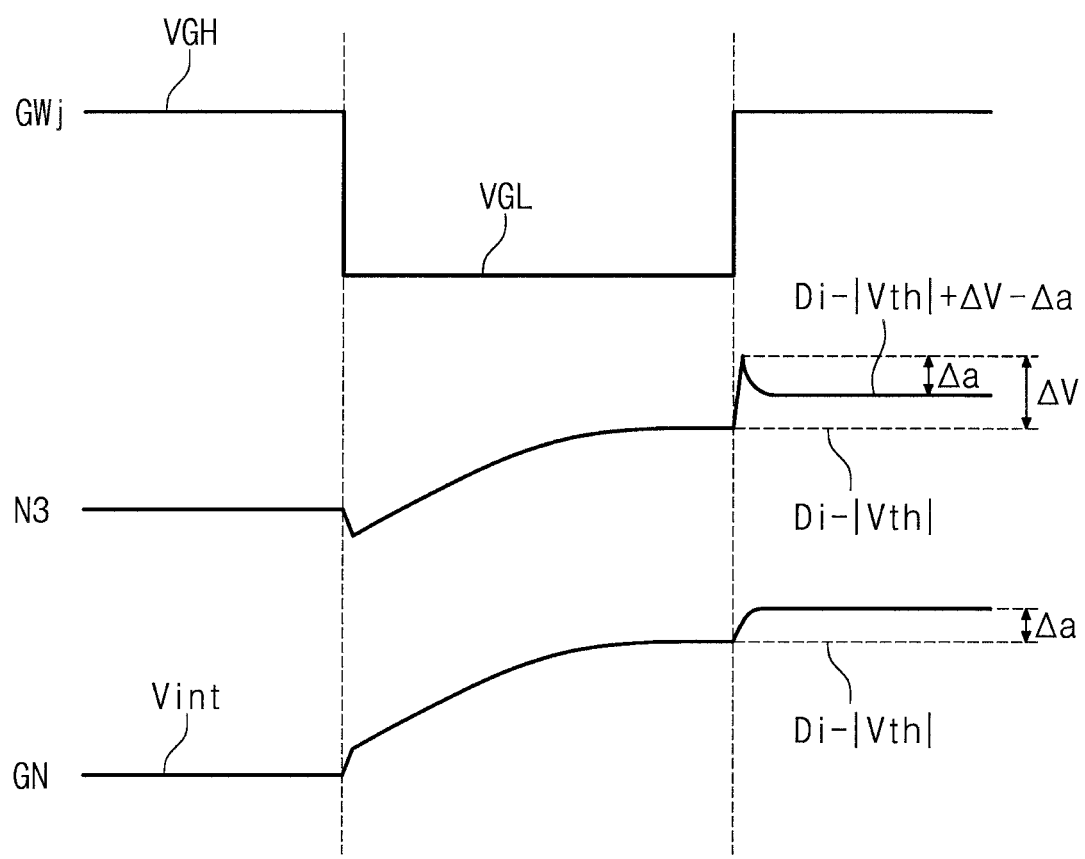
FIG. 7 is a waveform diagram illustrating a voltage level change of a third node and a driving gate node according to a change in a scan signal.

FIG. 6 is an equivalent circuit diagram for explaining sub-capacitors and parasitic capacitances formed by the first sub-transistor and the second sub-transistor shown in FIG. 2 (e.g. first sub-transistor T3_1 and second sub-transistor T3_2). FIG. 7 is a waveform diagram illustrating a voltage level change of a third node and a driving gate node according to a change in a scan signal.

Referring to FIGS. 6 and 7, when the scan signal GWj of the low level VGL is supplied through the first scan line 151 during the data programming and compensation period, the second transistor T2, the first sub-transistor T3_1, and the second sub-transistor T3_2 are turned on in response to the low-level scan signal GWj. At this time, the first transistor T1 is diode-connected by the turned-on first sub-transistor T3_1 and the turned-on second sub-transistor T3_2, and is biased in the forward direction. Then, the compensation voltage Di−|Vth|, which is the data signal Di supplied from the data line 171 reduced by the threshold voltage Vth of the first transistor T1, is applied to the gate electrode G1 of the first transistor T1 (see FIG. 2). That is, the driving gate node GN rises to a level of the voltage Di−|Vth|. In the same manner, the third node N3 also rises to a level of the voltage Di−|Vth|.

When the scan signal GWj transitions from the low level VGL to the high level VGH, the first sub-transistor T3_1 and the second sub-transistor T3_2 are turned off so that the third node N3 and the driving gate node GN should be maintained (e.g., maintained at a predetermined level, such as a level of the voltage Di−|Vth|). However, the voltage levels of the third node N3 and the driving gate node GN are changed by the auxiliary capacitor Cdd and the parasitic capacitors Cgd.

The voltage level of the driving gate node GN becomes higher by Δa, and the voltage level of the third node N3 rises by ΔV and then becomes lower by Δa.

ΔV is expressed by Equation 1 and ha is expressed by Equation 2.

$$\Delta V = \frac{Cgs}{Cgs + Cdd} \times (VGH - VGL) \qquad \text{Equation 1}$$

$$\Delta a = \frac{1}{Cgs + Cdd} \times i\_leakage \times \Delta t \qquad \text{Equation 2}$$

As may be seen from Equation 1 and Equation 2, if the capacitance of the auxiliary capacitor Cdd is increased, ΔV and Δa may be reduced.

The driving transistor T1 (see FIG. 2) has a hysteresis characteristic in which a response characteristic in a current frame is varied according to an operation state in a previous frame. That is, even if the driving transistor T1 receives a data signal Di of the same voltage level, it is possible to generate drive currents of different levels in the current frame according to the operation state in the previous frame. Accordingly, in the organic light emitting display, even if the same respective data voltage is applied to the pixel representing the black color and to the pixel representing the white color in the previous frame, the pixels may have different respective luminances in the current frame. To reduce or prevent luminance unevenness due to the hysteresis of the driving transistor, the organic light emitting display device is initialized to the on-bias state of the driving transistor T1 before the pixel emits light. Thus, as all the driving transistors included in the organic light emitting display device have the same response characteristic, the luminance unevenness due to the hysteresis may be reduced. But, as described above, the voltage levels of the third node N3 and the driving gate node GN change by ΔV and Δa, so that Vgs and Vds of the first sub-transistor T3_1 decrease. The reduction of Vgs and Vds of the first sub-transistor T3_1 causes a leakage current through the source-drain terminal of the first sub-transistor T3_1 so that this may cause a change in the voltage level of the driving gate node GN and may reduce or deteriorate the hysteresis characteristic of the driving transistor T1.

In the present embodiment, by increasing the capacity of the auxiliary capacitor Cdd, ΔV in Equation 1 and Δa in Equation 2 may be reduced. Deterioration of the hysteresis characteristic of the driving transistor T1 may be reduced or prevented by stably maintaining the voltage level of the driving gate node GN at the level of the voltage Di−|Vth|.

Figure 8:
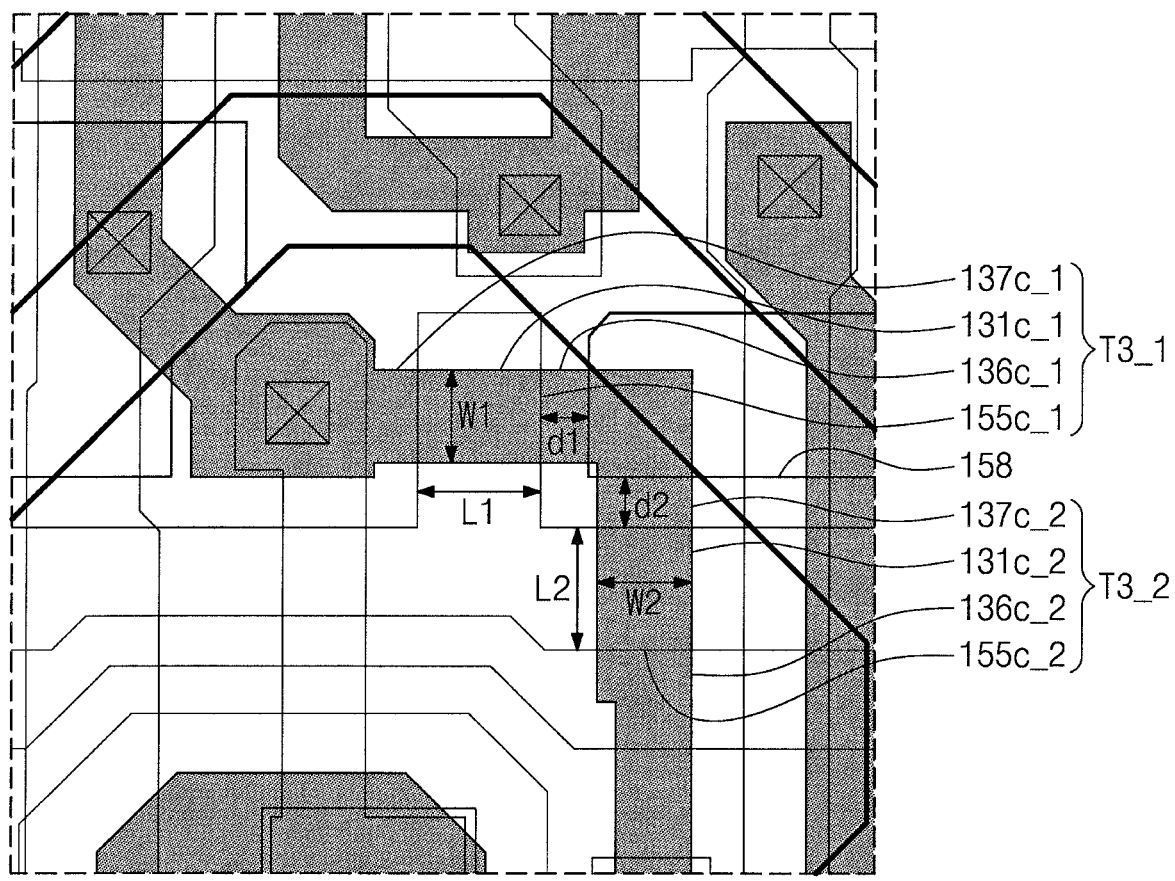
FIGS. 8 and 9 are enlarged plan views of the first sub-transistor and the second sub-transistor of the pixel shown in FIG. 4.
Figure 9:
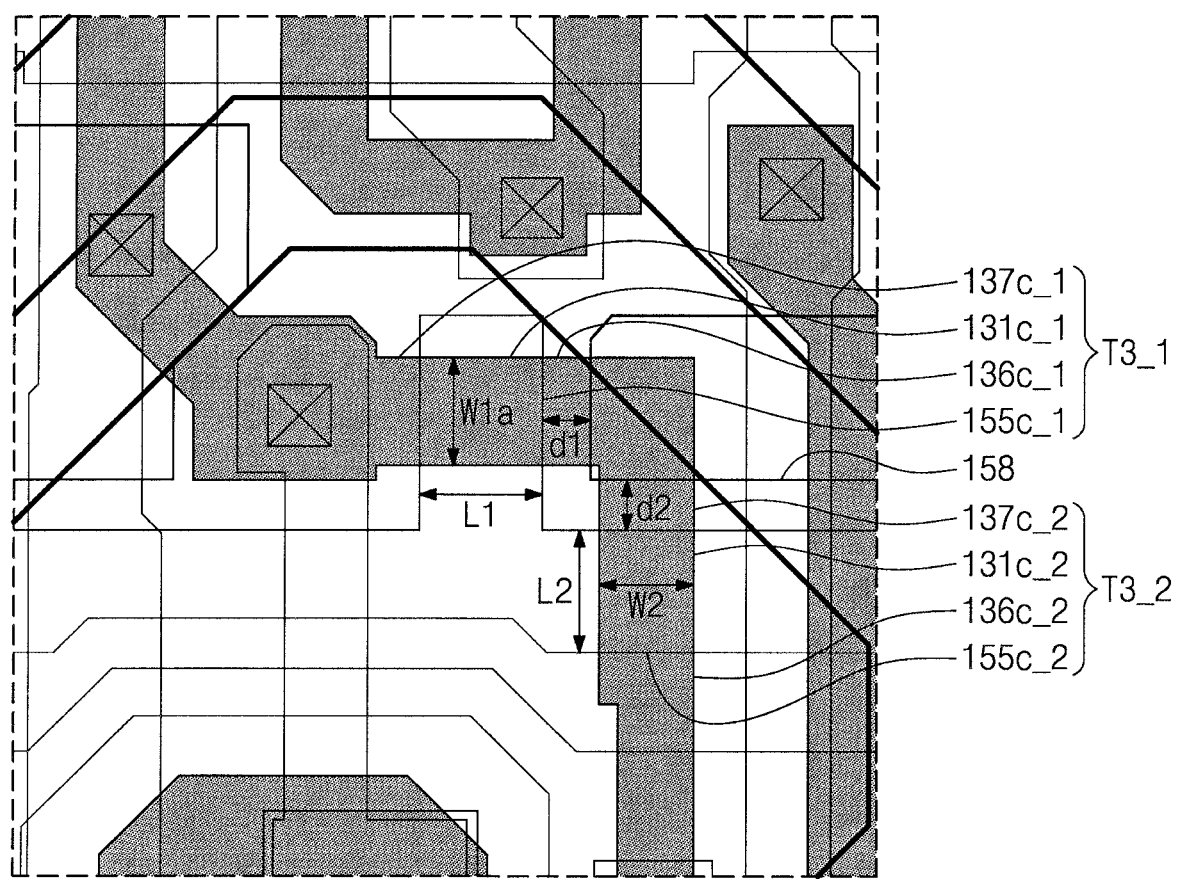

FIGS. 8 and 9 are enlarged plan views of the first sub-transistor and the second sub-transistor of the pixel shown in FIG. 4.

FIG. 8 shows an example in which the width and the length of the first sub-channel region of the first sub-transistor are the same as the width and the length of the second sub-channel region of the second sub-transistor.

First, referring to FIG. 8, on a plane, the distance d1 from the boundary between the first sub-channel region 131c_1 and the source region 136c_1 of the first sub-transistor T3_1 to the left edge of the shielding pattern 158 should be maintained (e.g., maintained at a predetermined distance or more). The distance d2 from the boundary between the second sub-channel region 131c_2 and the drain region 137c_2 of the second sub-transistor T3_2 to the lower edge of the shielding pattern 158 should be maintained at a predetermined distance or more.

In an embodiment, the width W1 (i.e., the length in the second direction DR2) of the first sub-channel region 131c_1 of the first sub-transistor T3_1 may be substantially equal to the width W2 of the second sub-channel region 131c_2 of the second sub-transistor T3_2 (e.g., W1=W2). The length L1 (i.e., the length in the first direction DR1) of the first sub-channel region 131c_1 of the first sub-transistor T3_1 may be substantially equal to the length L2 of the second sub-channel region 131c_2 of the second sub-transistor T3_2 (L1=L2).

Figure 5:
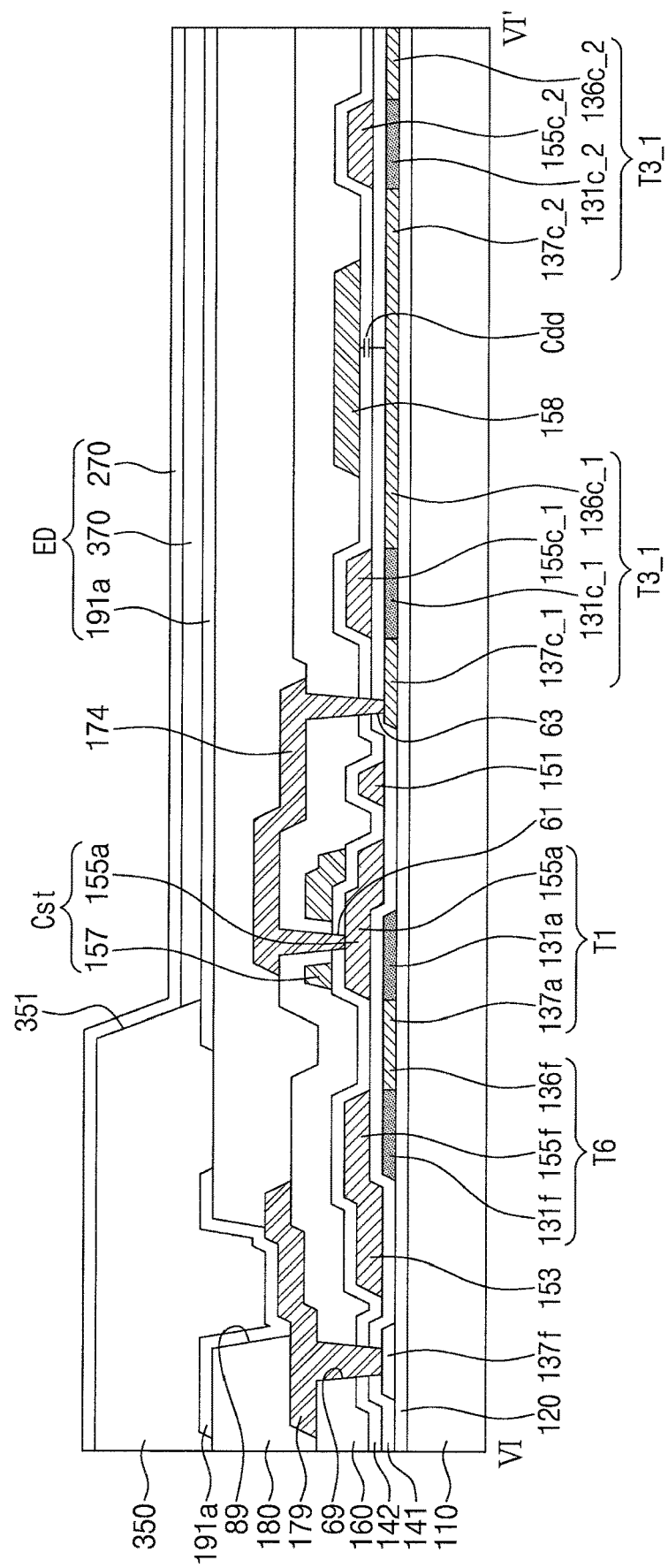
FIG. 5 is a cross-sectional view taken along the line VI-VI' of the display device shown in FIG. 4.

On a plane (e.g., the shielding pattern 158 overlaps the first sub-source region 136c_1 of the first sub-transistor T3_1 and the second sub-drain region 137c_2 of the second sub-transistor T3_2 to form an auxiliary capacitor Cdd (see FIG. 5). It should be noted that, in embodiments of the present disclosure, the shielding pattern 158 does not overlap the first sub-channel region 131c_1. Further, in embodiments of the present disclosure, the shielding pattern 158 does not overlap the second sub-channel region 131c_2.

As described above with reference to FIGS. 6 and 7, the capacitance of the auxiliary capacitor Cdd may be sufficiently large, and one of the methods for increasing the capacitance of the auxiliary capacitor Cdd is to increase the area of the shielding pattern 158 overlapping the first sub-source region 136c_1 and the second sub-drain region 137c_2. However, the area of the shielding pattern 158 is within a limited pixel area.

FIG. 9 shows an example in which the width of the first sub-channel region of the first sub-transistor is greater than the width of the second sub-channel region of the second sub-transistor.

Referring to FIG. 9, the width W1$a$ (i.e., the length in the second direction DR2) of the first sub-channel region 131$c$1 of the first sub-transistor T3_1 is greater than the width W2 of the second sub-channel region 131$c$_2 of the second sub-transistor T3_2 (e.g., W1$a$>W2). For example, the width W1$a$ of the first sub-channel region 131$c$1 may be about 0.5 µm larger than the width W2 of the second sub-channel region 131$c$2 of the second sub-transistor T3_2. As the width W1$a$ of the first sub-channel region 131$c$_1 of the first sub-transistor T3_1 increases, because the overlapping area between the first sub-channel region 131$c$_1 and the shielding pattern 158 is increased, the capacitance of the auxiliary capacitor Cdd increases.

In the example shown in FIG. 9, although the width W1$a$ of the first sub-channel region 131$c$_1 of the first sub-transistor T3_1 is increased (e.g., in comparison to the example shown in FIG. 8), in another embodiment, the width W2 of the second sub-channel region 131$c$_2 of the second sub-transistor T3_2 may be increased. In another example, the width W1$a$ of the first sub-channel region 131$c$_1 and the width W2 of the two sub-channel regions 131$c$_2 of the first sub-transistor T3_1 may both be increased.

Figure 10:
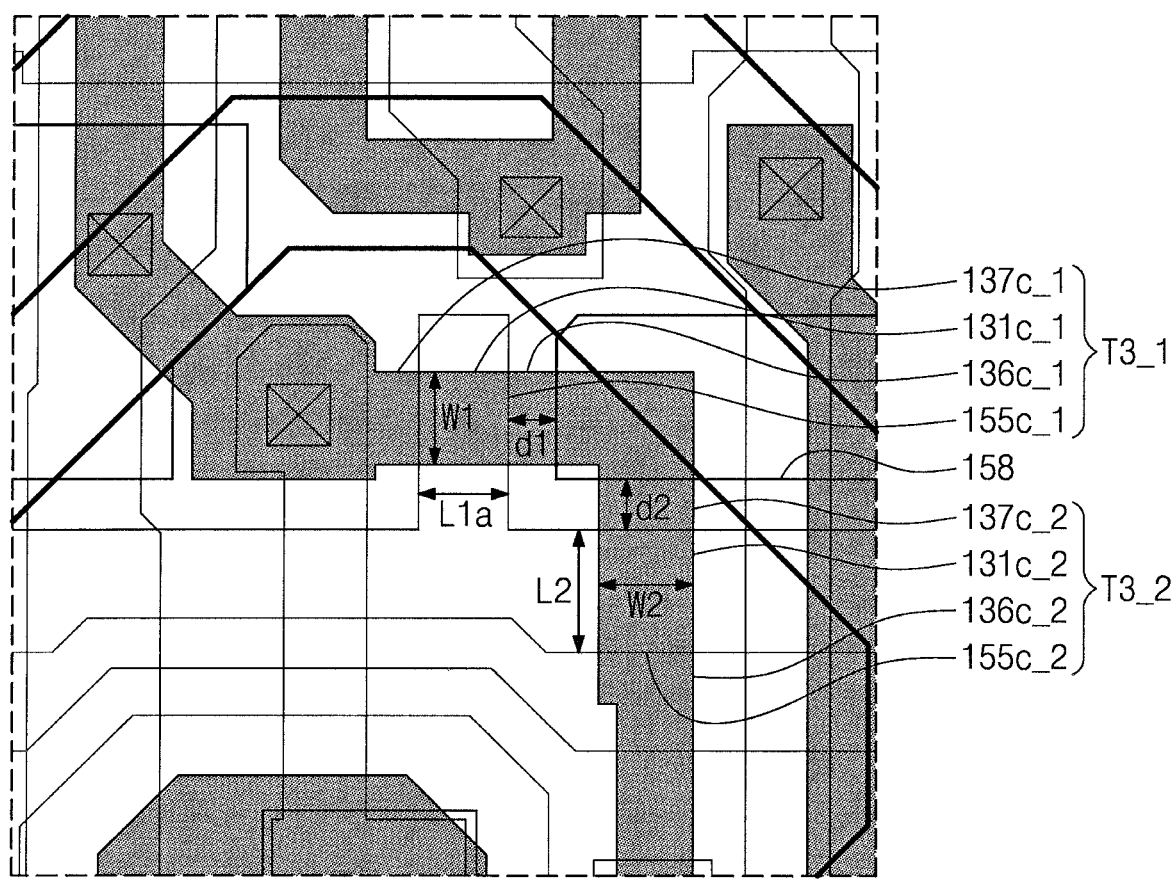
FIG. 10 shows an example in which the length of the first sub-channel region of the first sub-transistor is greater than the length of the second sub-channel region of the second sub-transistor.

FIG. 10 shows an example in which the length of the first sub-channel region of the first sub-transistor is greater than the length of the second sub-channel region of the second sub-transistor.

Referring to FIG. 10, the length L1$a$ (e.g., the length in the first direction DR1) of the channel region 131$c$_1 of the first sub-transistor T3_1 is shorter than the length L2 of the channel region 131$c$_2 of the second sub-transistor T3_2 (e.g., L1$a$<L2). As the length L1$a$ of the channel region 131$c$_1 becomes shorter, the shielding pattern 158 may extend longer in the first direction DR1. That is, as the area of the shielding pattern 158 increases, because the overlapping area between the first sub-channel region 131$c$_1 and the shielding pattern 158 is increased, the capacitance of the auxiliary capacitor Cdd increases.

According to the embodiments shown in FIGS. 9 and 10, it is possible to increase the space utilization efficiency and to form the auxiliary capacitor Cdd having a sufficient capacity.

A display device according to various embodiments will be described with reference to FIGS. 11 to 12 together with the drawings described above. The same description of the same components as those of the above-described embodiment will be omitted.

Figure 11:
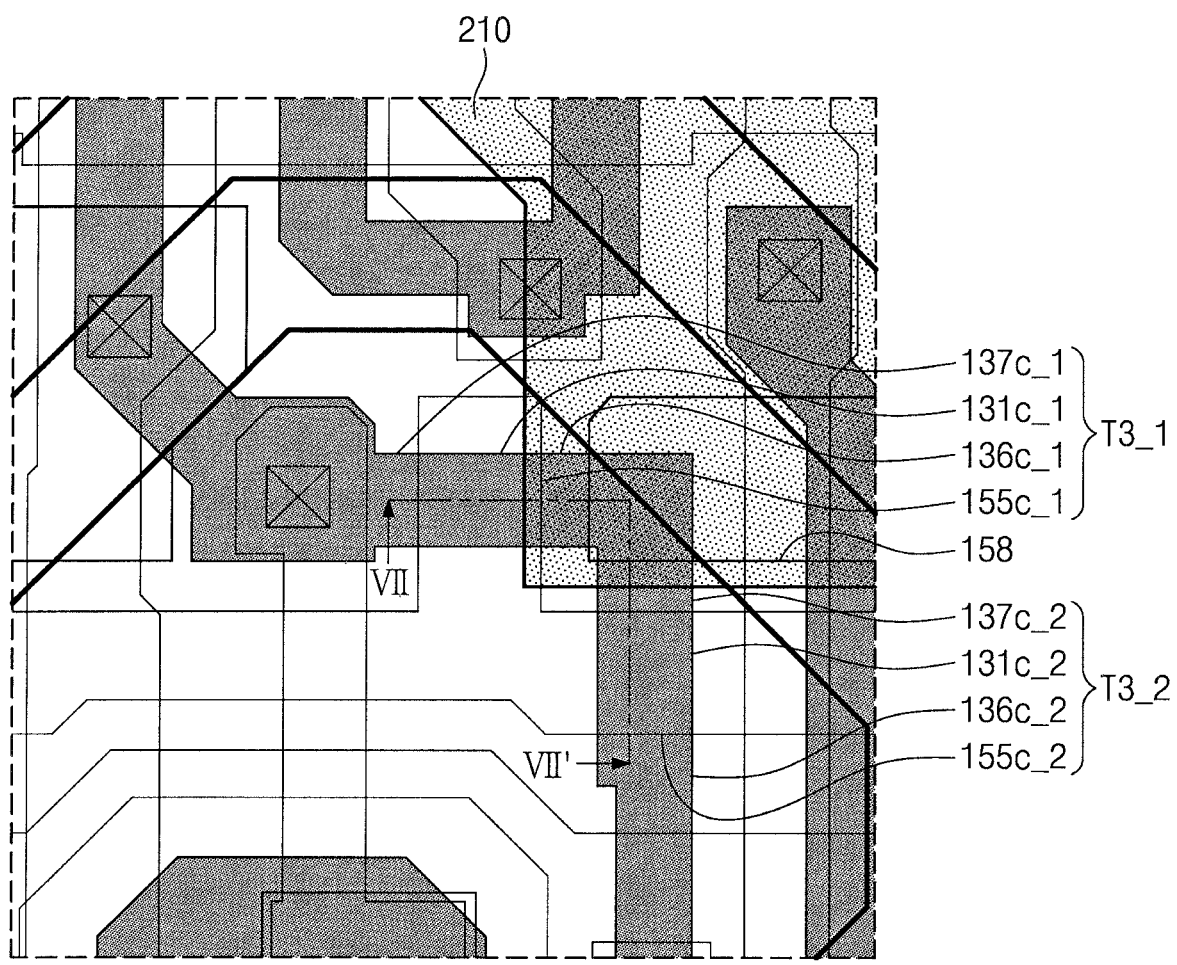
FIG. 11 is a plan view of a portion of a pixel according to an embodiment of the present disclosure.

FIG. 11 is a plan view of a portion of a pixel according to an embodiment of the present disclosure. FIG. 12 is a cross-sectional view taken along the line VII-VII' of the display device shown in FIG. 11.

Figure 12:
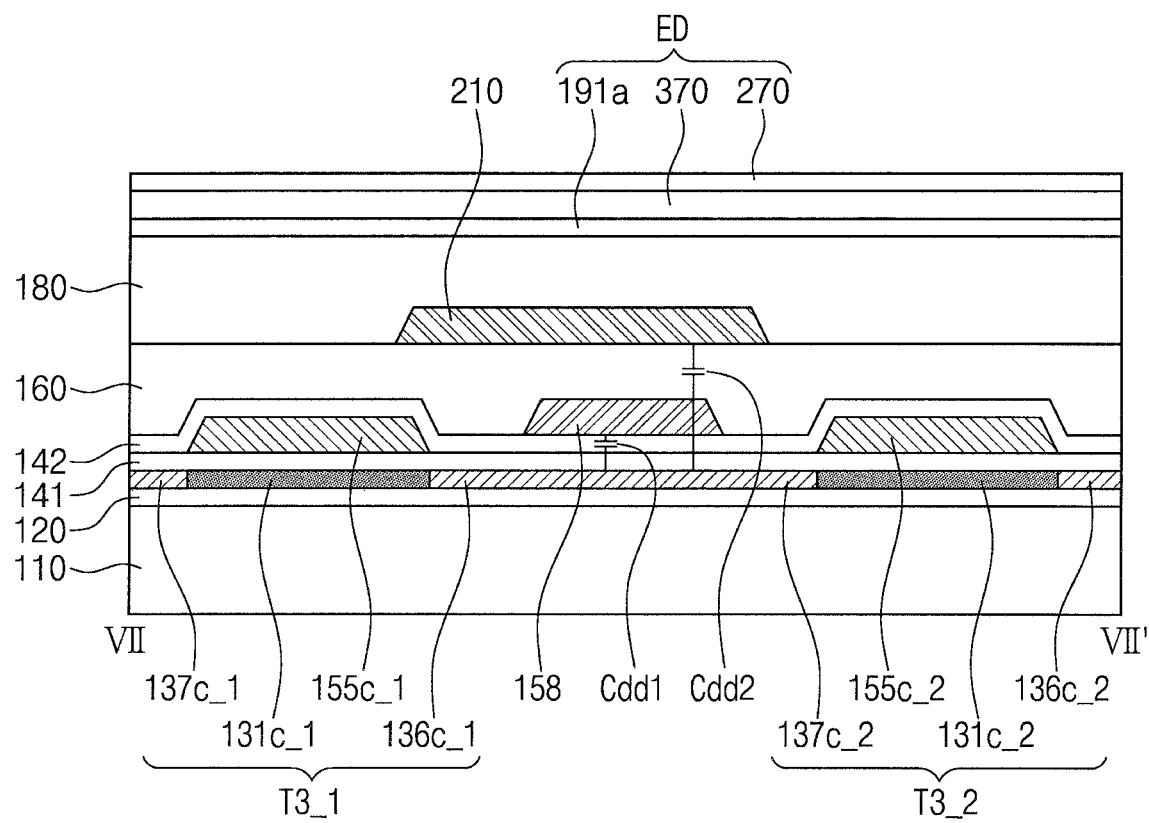
FIG. 12 is a cross-sectional view taken along the line VII-VII' of the display device shown in FIG. 11.

A pixel shown in FIGS. 11 and 12 further include an upper shielding pattern 210. The upper shielding pattern 210 may be arranged on the third insulating layer 160. In some embodiments, the upper shielding pattern 210 may be connected to the driving voltage line 172 shown in FIG. 3 through a contact hole. The upper shielding pattern 210 may be located on a different layer from the shielding pattern 158 with the third insulating layer 160 therebetween. The upper shielding pattern 210 may be located on the same layer as the connection member 174 (e.g., in the third conductive layer).

The upper shielding pattern 210 overlaps the first sub-source region 136$c$_1 of the first sub-transistor T3_1 and the second sub-drain region 137$c$_2 of the second sub-transistor T3_2 to form the second auxiliary capacitor Cdd2.

By a parallel connection structure of the first auxiliary capacitor Cdd1 between the shielding pattern 158 and both of the first sub-source region 136$c$_1 and the second sub-drain region 137$c$_2, and of the second auxiliary capacitor Cdd2 between the upper shielding pattern 210 and both of the first sub-source region 136$c$_1 and the second sub-drain region 137$c$_2, the total capacitance may increase.

Figure 13:
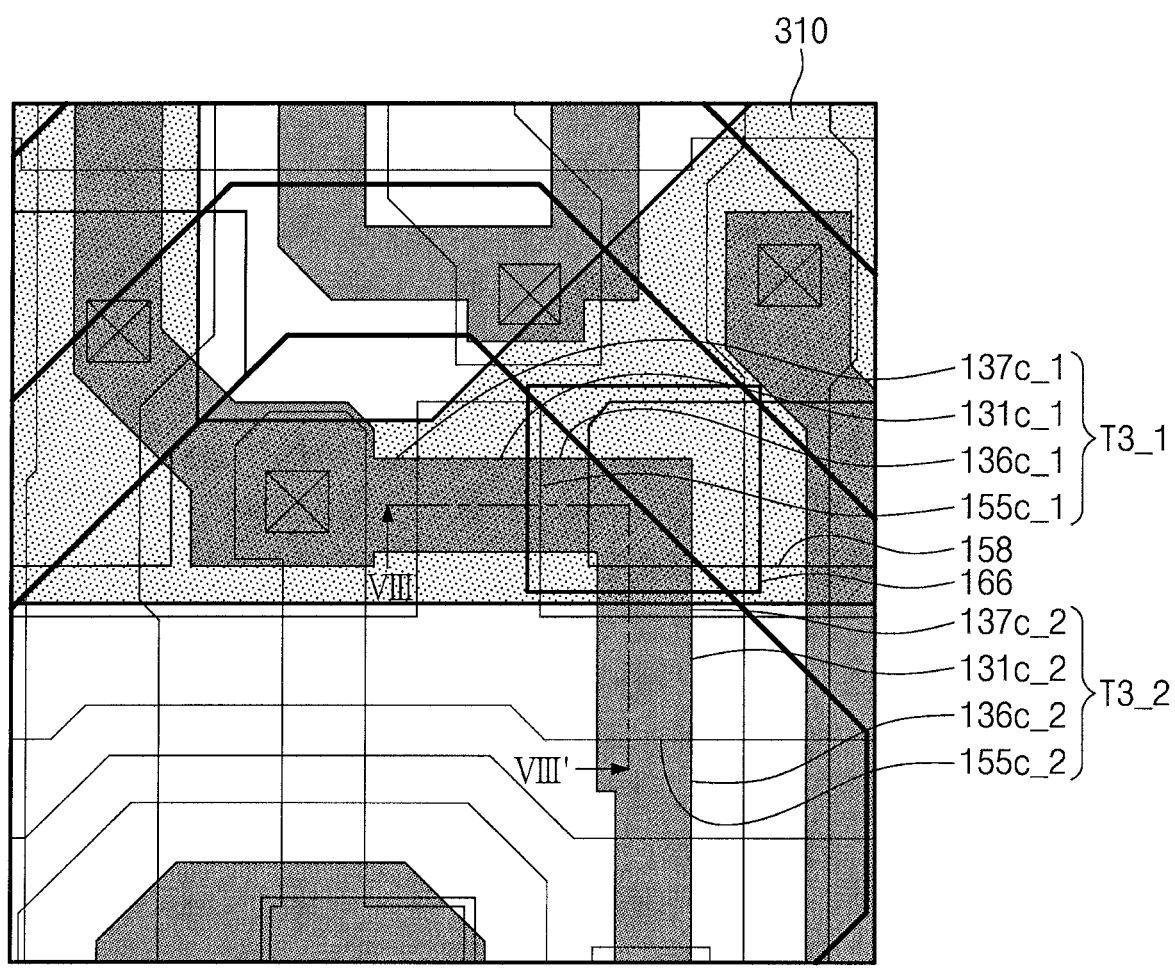
FIG. 13 is a plan view of a portion of a pixel according to an embodiment of the present disclosure.
Figure 14:
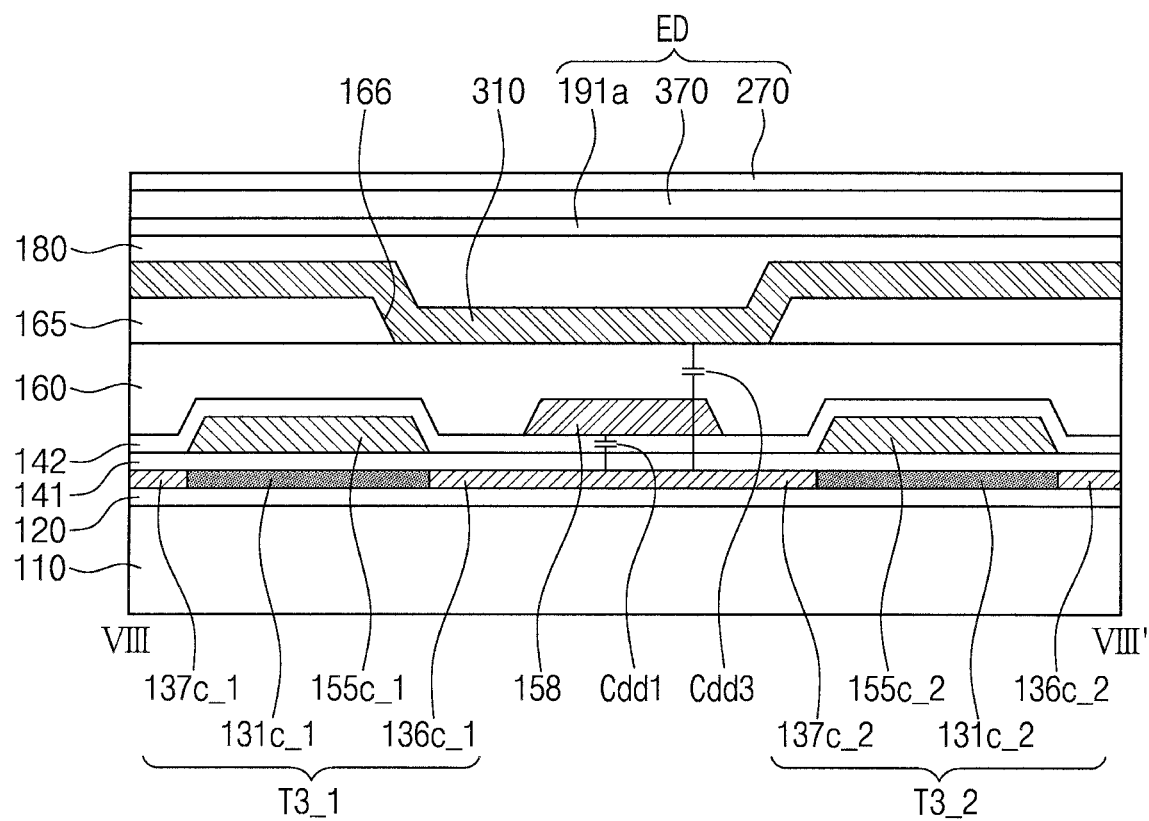
FIG. 14 is a cross-sectional view taken along the line VIII-VIII' of the display device shown in FIG. 13.

FIG. 13 is a plan view of a portion of a pixel according to an embodiment of the present disclosure. FIG. 14 is a cross-sectional view taken along the line VIII-VIII' of the display device shown in FIG. 13.

A pixel shown in FIGS. 13 and 14 includes an upper shielding pattern 310. The upper shielding pattern 310 may be arranged on the fourth insulating layer 165. The fourth insulating layer 165 may be formed on the third insulating layer 160. In some embodiments, the upper shielding pattern 310 may be connected to the driving voltage line 172 shown in FIG. 3 through a contact hole. The upper shielding pattern 310 may be located on a different layer from the shielding pattern 158 with the third insulating layer 160 and the fourth insulating layer 165 therebetween. The fourth insulating layer 165 has an opening part 166 overlapping the second sub-drain region 137$c$_2 of the second sub-transistor T3_2.

The upper shielding pattern 310 overlaps the first sub-source region 136$c$_1 of the first sub-transistor T3_1 and the second sub-drain region 137$c$_2 of the second sub-transistor T3_2 to form the third auxiliary capacitor Cdd3. In this embodiment, the distance between the upper shielding pattern 310 and the second sub-drain region 137$c$_2 is reduced by the opening part 166 of the upper shielding pattern 310 so that the capacity of the third auxiliary capacitor Cdd3 may be increased.

By a parallel connection structure of the first auxiliary capacitor Cdd1 between the shielding pattern 158 and both of the first sub-source region 136$c$_1 and the second sub-drain region 137$c$_2, and the third auxiliary capacitor Cdd3 between the upper shielding pattern 310 and both of the first sub-source region 136$c$_1 and the second sub-drain region 137$c$_2, the total capacitance may increase.

The organic light emitting display having such a configuration may reduce the leakage current through the third transistor by increasing the capacitance between the connection node of the switching transistor having the dual gate electrode and the power supply voltage wiring. Therefore, the display quality of the organic light emitting display device may be improved.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

What is claimed is:

1. A pixel comprising:
   a light emitting diode comprising an anode and a cathode;
   a first transistor comprising a first drain region electrically connected to the anode of the light emitting diode, a first gate electrode, a first channel region overlapping the first gate electrode in a plan view, and a first source region facing the first drain region with the first channel region therebetween;
   a first sub-transistor comprising a first sub-gate electrode, a first sub-channel region overlapping the first sub-gate electrode in a plan view, a first sub-drain region connected to the first gate electrode, and a first sub-source region facing the first sub-drain region with the first sub-channel region therebetween;

a second sub-transistor comprising a second sub-gate electrode, a second sub-channel region overlapping the second sub-gate electrode in a plan view, a second sub-drain region connected to the first sub-source region, and a second sub-source region facing the second sub-drain region with the second sub-channel region therebetween; and a shielding pattern overlapping the first sub-source region and the second sub-drain region in a plan view and not overlapping the first sub-channel region, wherein a width of the first sub-channel region is greater than a width of the second sub-channel region, and wherein the first transistor is configured to be diode-connected by the first sub-transistor and the second sub-transistor when the first sub-transistor and the second sub-transistor are turned on.

2. The pixel of claim 1, wherein the shielding pattern is configured to receive a driving voltage.

3. The pixel of claim 2, wherein the shielding pattern overlaps the first sub-source region and the second sub-drain region to form an auxiliary capacitor.

4. The pixel of claim 1, wherein the shielding pattern does not overlap the second sub-channel region in a plan view.

5. The pixel of claim 1, further comprising an extension part on a different layer than, and overlapping, the first gate electrode to form a capacitor.

6. The pixel of claim 5, wherein the shielding pattern is on the same layer as the extension part.

7. The pixel of claim 1, wherein a length of the first sub-channel region is shorter than a length of the second sub-channel region.

8. The pixel of claim 1, further comprising a sixth transistor comprising a sixth source region connected to the first drain region of the first transistor, a sixth drain region connected to the anode of the light emitting diode, and a sixth channel region between the sixth source region and the sixth drain region.

9. The pixel of claim 1, further comprising a connection member connected to, and on a different layer than, the first gate electrode, wherein the first sub-drain region is connected to the connection member.

10. The pixel of claim 9, further comprising an upper shielding pattern on the same layer as the connection member, and overlapping the first sub- source region and the second sub-drain region in a plan view.

11. The pixel of claim 9, further comprising a fourth transistor comprising a fourth gate electrode, a fourth channel region overlapping the fourth gate electrode in a plan view, a fourth drain region connected to the first gate electrode, and a fourth source region facing the fourth drain region with the fourth channel region therebetween.

12. An organic light emitting display device comprising:

a scan driving circuit configured to sequentially provide scan signals to scan lines extending in a first direction and arranged in a second direction that is orthogonal to the first direction;

a data driving circuit configured to provide data signals to data lines that insulatingly cross the scan lines; and pixels comprising a light emitting diode having an anode and a cathode, and a circuit part configured to control a light emission of the light emitting diode, the circuit part comprising:

a first transistor comprising a first drain region electrically connected to the anode of the light emitting diode, a first gate electrode, a first channel region overlapping the first gate electrode in a plan view, and a first source region facing the first drain region with the first channel region therebetween;

a first sub-transistor comprising a first sub-gate electrode, a first sub-channel region overlapping the first sub-gate electrode in a plan view, a first sub-drain region connected to the first gate electrode, and a first sub-source region facing the first sub-drain region with the first sub-channel region therebetween;

a second sub-transistor comprising a second sub-gate electrode, a second sub-channel region overlapping the second sub-gate electrode in a plan view, a second sub-drain region connected to the first sub-source region, and a second sub-source region facing the second sub-drain region with the second sub-channel region therebetween; and a shielding pattern overlapping the first sub-source region and the second sub-drain region in a plan view and not overlapping the first sub-channel region, wherein a width of the first sub-channel region is greater than a width of the second sub-channel region, and wherein the first transistor is configured to be diode-connected by the first sub-transistor and the second sub-transistor when the first sub-transistor and the second sub-transistor are turned on.

13. The organic light emitting display device of claim 12, wherein the shielding pattern is configured to receive a driving voltage.

14. The organic light emitting display device of claim 12, wherein the circuit part further comprises an upper shielding pattern on a different layer from the shielding pattern, and overlapping the first sub-source region and the second sub-drain region in a plan view.

* * * * *